(12) United States Patent
Sharpe-Geisler et al.

(10) Patent No.: US 6,218,857 B1
(45) Date of Patent: Apr. 17, 2001

(54) VARIABLE SIZED LINE DRIVING AMPLIFIERS FOR INPUT/OUTPUT BLOCKS (IOBS) IN FPGA INTEGRATED CIRCUITS

(75) Inventors: Bradley A. Sharpe-Geisler; Giap Tran, both of San Jose, CA (US)

(73) Assignee: Vantis Corporation, San Jose, CA (US)

( * ) Notice: Subject to any disclaimer, the term of this patent is extended or adjusted under 35 U.S.C. 154(b) by 0 days.

(21) Appl. No.: 09/198,796

(22) Filed: Nov. 24, 1998

(51) Int. Cl.[7] ................. H03K 19/177; H03K 19/094
(52) U.S. Cl. ................................ 326/39; 326/86
(58) Field of Search ................. 326/39, 41, 56–58, 326/83, 86–87, 17; 257/369

(56) References Cited

U.S. PATENT DOCUMENTS

| | | | |
|---|---|---|---|
| 5,212,652 | * 5/1993 | Agrawal et al. | 326/41 |
| 5,362,999 | * 11/1994 | Chiang | 326/44 |
| 5,537,057 | * 7/1996 | Leong et al. | 326/41 |
| 5,581,199 | 12/1996 | Pierce et al. | 326/41 |
| 5,617,043 | * 4/1997 | Han et al. | 326/83 |
| 5,841,702 | * 11/1998 | Kim | 365/189.05 |
| 6,049,113 | * 4/2000 | Shida | 257/369 |

* cited by examiner

*Primary Examiner*—Michael Tokar
*Assistant Examiner*—James H. Cho
(74) *Attorney, Agent, or Firm*—Fliesler Dubb Meyer & Lovejoy LLP

(57) ABSTRACT

An input/output block (IOB) in a field programmable gate array (FPGA) efficiently provides signals to an inter-connect network in the FPGA device. The IOB is one of a plurality of IOBs positioned about a plurality of variable grain blocks (VGBs) in the FPGA device. The IOB includes a first sized line driving amplifier for generating a first signal at a first IOB output. A second sized line driving amplifier generates a second signal at a second IOB output. The first sized line driving amplifier includes a PMOS transistor having a polysilicon gate width of approximately 20 microns and an NMOS transistor having a polysilicon gate width of approximately 10 microns. The second sized line driving amplifier includes a PMOS transistor, an NMOS transistor, a NAND gate, NOR gate and inverter. The second sized amplifier PMOS transistor has a polysilicon gate width of approximately 35 microns and an NMOS transistor having a polysilicon gate width of approximately 15 microns. The IOB has multiple outputs connected to various inter-connect network resources. An IOB output is coupled to a (1) direct connect line, (2) NOR line, (3) dendrite line and (4) MaxL line. The various lines may have a predetermined length and/or capacitance. The various sized amplifiers in the IOB are sized dependent upon the respective line types connected to the IOB. The various sized amplifiers allow for the reduction of undue signal propagation delays or unnecessarily large sized amplifiers.

13 Claims, 13 Drawing Sheets

VARIABLE SIZED LINE DRIVING AMPLIFIERS FOR INPUT/OUTPUT BLOCKS (IOBS) IN FPGA INTEGRATED CIRCUITS

BACKGROUND

1. Field of the Invention

The invention is generally directed to integrated circuits, more specifically to Programmable Logic Devices (PLDs), and even more specifically to a subclass of PLDs known as Field Programmable Gate Arrays (FPGAs).

2a. Cross Reference to Related Applications

The following copending U.S. patent applications are assigned to the assignee of the present application, and their disclosures are incorporated herein by reference:

(A) Ser. No. 08/995,614 [Attorney Docket No. AMDI8237] filed Dec.22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(B) Ser. No. 08/912,763 [Attorney Docket No. AMDI8195] filed Aug. 18, 1997, by Bradley A. Sharpe-Geisler and originally entitled, "OUTPUT BUFFER FOR MAKING A 2.5 VOLT CIRCUIT COMPATIBLE WITH A 5.0 VOLT CIRCUIT";

(C) Ser. No. 08/948,306 [Attorney Docket No. AMDI8222] filed Oct. 9, 1997, by Om Agrawal et al. and originally entitled, "VARIABLE GRAIN ARCHITECTURE FOR FPGA INTEGRATED CIRCUITS";

(D) Ser. No. 08/996,361 [Attorney Docket No. AMDI8223] filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(E) Ser. No. 08/995,615 [Attorney Docket No. AMDI8236] filed Dec. 22, 1997, by Om Agrawal et al. and originally entitled, "A PROGRAMMABLE INPUT/ OUTPUT BLOCK (IOB) IN FPGA INTEGRATED CIRCUITS";

(F) Ser. No. 08/995,612 [Attorney Docket No. AMDI8238] filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";

(G) Ser. No. 08/997,221 [Attorney Docket No. AMDI8239] filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";

(H) Ser. No. 08/996,119 [Attorney Docket No. AMDI8263] filed Dec. 22, 1997, by Bradley Sharpe-Geisler and originally entitled, "MULTIPLE INPUT ZERO POWER AND/NOR GATE FOR USE WITH A FIELD PROGRAMMABLE GATE ARRAY (FPGA)"; and, (I) Ser. No. 08/996,442 [Attorney Docket No. AMDI8267] filed Dec. 22, 1997, by Bradley Sharpe-Geisler and originally entitled, "INPUT BUFFER PROVIDING VIRTUAL HYSTERESIS".

2b. Cross Reference to Related Patents

The following U.S. patents are assigned to the assignee of the present application, and their disclosures are incorporated herein by reference:

(A) U.S. Pat. No. 5,212,652, issued May 18, 1993 to Om Agrawal et al. and entitled, "PROGRAMMABLE GATE ARRAY WITH IMPROVED Inter-connect STRUCTURE";

(B) U.S. Pat. No. 5,621,650, issued Apr. 15, 1997 to Om Agrawal et al. and entitled, "PROGRAMMABLE LOGIC DEVICE WITH INTERNAL TIME-CONSTANT MULTIPLEXING OF SIGNALS FROM EXTERNAL INTERCONNECT BUSES";

(C) U.S. Pat. No. 5,185,706, issued Feb. 9, 1993 to Om Agrawal et al. and entitled, "PROGRAMMABLE GATE ARRAY WITH LOGIC CELLS HAVING CONFIGURABLE OUTPUT ENABLE"; and (D) U.S. Pat. No. 5,740,069, issued Apr. 14, 1998 to Om Agrawal et al. and entitled, "LOGIC DEVICE (PLD) HAVING DIRECT CONNECTIONS BETWEEN CONFIGURABLE LOGIC BLOCKS (CLBs) AND CONFIGURABLE INPUT/OUTPUT BLOCKS (IOBs)".

3. Description of Related Art

Field-Programmable Logic Devices (FPLDs) have continuously evolved to better serve the unique needs of different end-users. From the time of introduction of simple PLDs such as the Advanced Micro Devices 22V10 Programmable Array Logic device (PAL), the art has branched out in several different directions.

One evolutionary branch of FPLDs has grown along a paradigm known as Complex PLDs or CPLDs. This paradigm is characterized by devices such as the Advanced Micro Devices MACH family. Examples of CPLD circuitry are seen in U.S. Pat. Nos. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGAs. Examples of such devices include the XC2000 and XC3000 families of FPGA devices introduced by Xilinx, Inc. of San Jose, Calif. The architectures of these devices are exemplified in U.S. Patent Nos. 4,642,487; 4,706,216; 4,713,557; and 4,758, 985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOBs) are provided for interconnecting other internal circuit components of the FPGA device with external circuitry. The IOBs' may have fixed configurations or they may be configurable in accordance with user-provided configuration instructions stored in the configuration-defining memory means.

(3) Configurable Logic Blocks (CLBs) are provided for carrying out user-programmed logic functions as defined by user-provided configuration instructions stored in the configuration-defining memory means. Typically, each of the many CLBs of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An inter-connect network is provided for carrying signal traffic within the FPGA device between various CLBs and/or between various IOBs and/or between various IOBs and CLBS. At least part of the inter-connect network is typically configurable so as to allow for programmably-defined routing of signals between various CLBs and/or IOBs in accordance with user-defined routing instructions stored in the configuration-defining memory means. Another part of the interconnect network may be hard wired or nonconfigurable such that it does not allow for programmed definition of the path to be taken by respective signals traveling along such hard wired inter-connect. A version of hard wired interconnect wherein a given conductor is dedicatedly connected to be always driven by a particular output driver, is sometimes referred to as 'direct connect'.

Typically, IOBs have a driving amplifier (or driver) for generating signals into the FPGA inter-connect network from the IOB. An IOB may have multiple amplifiers for driving different types of inter-connect lines in the inter-connect network. For example, a first amplifier may drive a direct connect line having a predetermined length to a CLB, while a second. amplifier may drive a much shorter or much longer line to another IOB. If an amplifier is not large enough to drive a relatively long line, signal propagation times may be unduly large. Similarly, if a relatively large amplifier is used to drive a relatively short line, resources are unnecessarily wasted and related circuitry is loaded down which reduces signal propagation time. Accordingly, an optimal driver size must be determined for each situation.

There are numerous factors that go into determining the size of a driver for generating a signal on a particular line in a FPGA device. First, load and/or layout of the line affects the optimal driver size. The driver size may be limited by series resistance or upstream capacitance on a particular line. A fan out orientation may induce hot carrier degradation. Second, the available silicon surface area may limit the size of a particular driver or limit other circuitry by requiring an unnecessarily large driver. Third, a relatively large driver may have slower overall performance because of related circuitry or a prior stage. A large driver must have a larger gate capacitance driver which may slow down driver performance. Fourth, a large amplifier may generate a larger signal but consume more power where a smaller power efficient amplifier may adequately provide a signal without unduly wasting power. A larger driver consumes more power because of the crowbar current effect and a larger driver has a larger gate capacitance which requires more current.

Therefore, it is desirable to efficiently transfer signals in an FPGA inter-connect network from an IOB. In particular, it is desirable to generate a signal that has appropriate strength for an inter-connect network resource coupled to the IOB so that undue delays are not encountered and/or resources are not wasted. It is desirable to provide an optimally sized driver which takes into account line load/layout, amplifier silicon area, related circuitry, and power consumption.

SUMMARY OF THE INVENTION

An input/output block (IOB) in a field programmable gate array (FPGA) device which efficiently transfers signals to an inter-connect network is provided.

In one aspect of the present invention, an IOB in an FPGA device comprises a first sized amplifier for generating a first signal and a second sized amplifier for generating a second signal.

In an embodiment, the first and second amplifiers each include a first Positive Metal Oxide Semiconductor ("PMOS") transistor and a first Negative Metal Oxide Semiconductor ("NMOS") transistor, respectively. The PMOS and NMOS transistors each include a polysilicon gate having a channel width and a channel length. The first sized amplifier has a PMOS polysilicon gate channel width of approximately 35 microns and a PMOS polysilicon gate length of approximately 0.25 microns. The first sized amplifier has an NMOS polysilicon gate width of approximately 15 microns and an NMOS polysilicon gate length of approximately 0.25 microns. The second sized amplifier has a PMOS polysilicon gate channel width of approximately 20 microns and a PMOS polysilicon gate length of approximately 0.25 microns. The second sized amplifier has an NMOS polysilicon gate width of approximately 10 microns and an NMOS polysilicon gate length of approximately 0.25 microns.

According to another aspect of the present invention, a first amplifier includes a PMOS transistor having a source coupled to $V_{cc}$ and a drain coupled to an NMOS transistor drain. The NMOS transistor source is coupled to ground. The PMOS drain and NMOS drain are coupled to an output line. The first amplifier also includes a NAND gate have an output coupled to a PMOS gate. A NOR gate output is coupled to an NMOS gate and an inverter output is coupled to a NOR gate input. The inverter input is coupled to a first line for carrying an OUTPUT ENABLE ("OE") signal. A NAND gate input and a NOR gate input is coupled to a second line for carrying a BUFFER IN ("BI") signal.

According to still another aspect of the present invention, the IOB further comprises a third sized amplifier for generating a third signal.

According to another aspect of the present invention, the first sized amplifier and the second sized amplifier is sized dependent upon the respective line types connected to the IOB.

According to still a further aspect of the present invention, the IOB is connected to a dendrite including a plurality of dendrite lines. The IOB is coupled to a NOR line. The IOB is also coupled to a direct connect line which is further connected to variable grain blocks (VGBs). The IOB is also connected to a MaxL line.

According to still another aspect of the present invention, an FPGA device comprises an IOB including a first sized line driving amplifier for generating a first signal at a first output and a second sized line driving amplifier for generating a second signal at a second output. An inter-connect network for carrying a plurality of signals is provided. The inter-connect network includes a first line coupled to the first IOB output which has a first capacitance. A second line is coupled to the second IOB output which also includes a second capacitance.

According to another aspect of the present invention, the FPGA device comprises a plurality of VGBs arranged substantially in a matrix. A plurality of IOBs are arranged about the plurality of VGBs. An IOB in the plurality of IOBs includes a first sized drive amplifier for generating a first signal at a first IOB output. A second sized driving amplifier generates a second signal at a second IOB output. The FPGA device also includes an inter-connect network for carrying a plurality of signals. The inter-connect network includes a first line which is coupled to the first IOB output. The first line has a predetermined first length. A second line in the inter-connect network is coupled to the second IOB output and has a second predetermined length.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
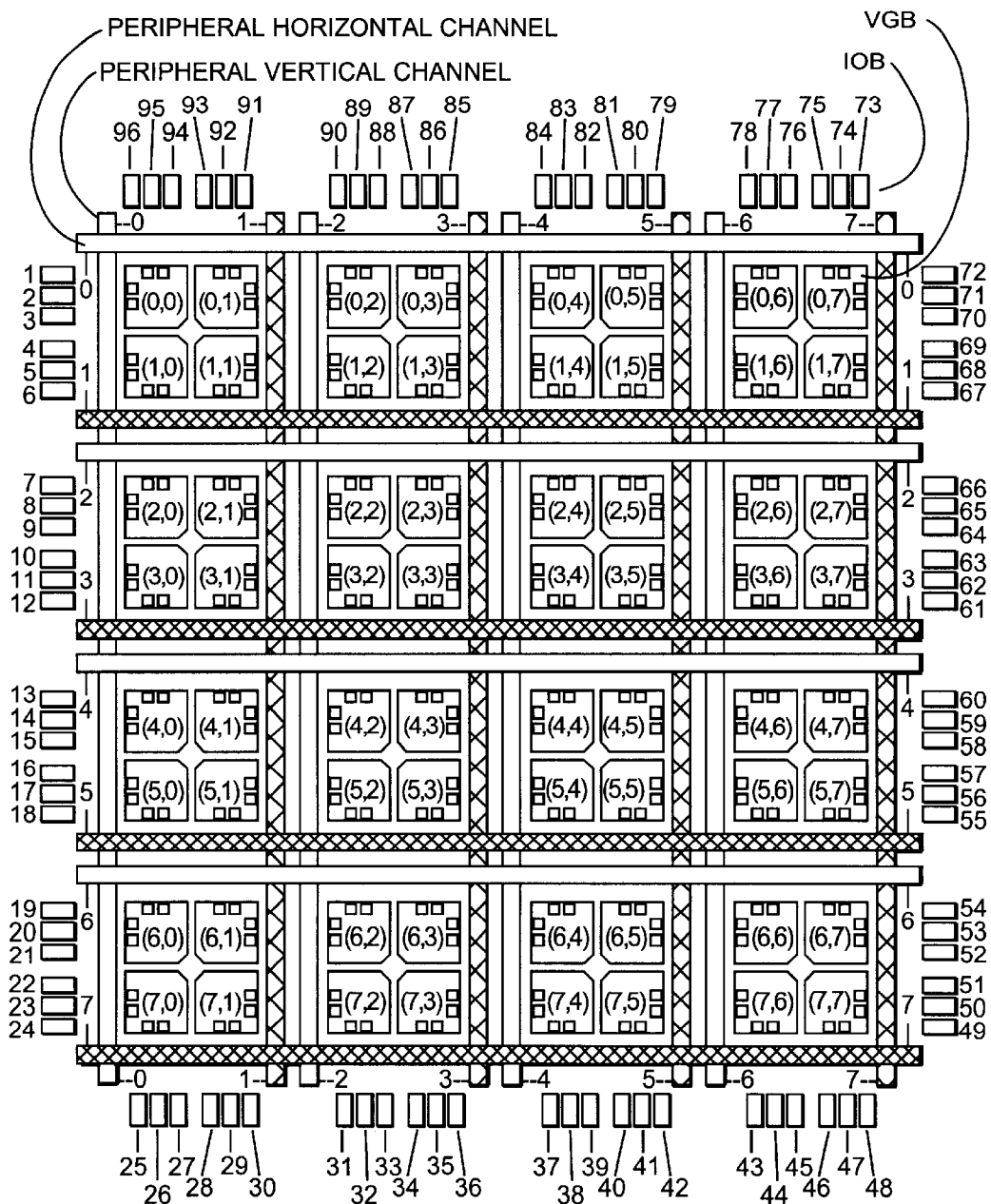
FIG. 1 illustrates a first FPGA in accordance with the invention having an 8×8 matrix of VGBs (a 4×4 tiled matrix of super-VGBs and surrounding inter-connect resources)

A number of FPGA terms will be used throughout the specification. The term "CLB" as used herein generally refers to a Boolean function generating block whose structure is essentially repeated throughout the device. Each CLB usually has at least one programmable lookup table (LUT), but may have more LUTs. Each CLB may have other resources such as data-storage elements (e.g., flip flops) and local feedback means for creating sequential state machines.

The term 'inter-connect network' as used herein generally refers to a repeated pattern of connection-providing resources which carry signal traffic between CLBs. An analogy can be made to the network of public highways (expressways) and public streets that carry vehicle traffic in modern cities. The inter-connect network of an FPGA may also include connection-providing resources that can carry signal traffic between CLBs and input/output blocks (IOBs). As used herein, 'IOB' refers to a repeated structure that provides interface between points outside the FPGA device and FPGA-internal components.

The term 'intra-connection' resources (note the 'ra' sequence before the hyphen) is used herein to refer to connection-providing resources that are dedicated to carrying signals essentially only inside a particular entity such as a CLB or an IOB. Such intra-connection resources are to be distinguished from 'inter-connection resources' (note the were sequence before the hyphen). In general, intraconnection is a relative term which should accompany the entity to which it is dedicated. Thus CLB-intraconnection refers to connection resources that are dedicated to carrying signals essentially only inside a particular CLB.

The term 'inter-connection resources' is used herein to refer to connection-providing resources that can carry signals between two or more CLBs and/or between two or more IOBs and/or between a CLB and an IOB.

To distinguish intra-connection resources over interconnection resources, an analogy can be made to the private driveway of a private house as distinguished from an adjacent public highway (expressway) or an adjacent public street, where the latter generally carries passing-by general traffic as well as private traffic of the private driveway.

Inter-connection resources in the FPGA include both those that provide programmable routing of signals between any desired CLBs and/or IOBs and those that provide fixed routing (hardwired transmission) of signals between specific IOBs and/or specific CLBs. One type of fixed-route inter-connect resource is a line that is always (fixedly) driven by a dedicated output but can have its carried signal programmably coupled to one or more inputs. Such unidirectional, fixed-route lines are generally referred to herein as 'direct connect lines'.

Inter-connect resources which provide programmably-definable routing of signals between CLBs and/or IOBs can include a maximum length, lines (MaxL lines) which span essentially the full workable length of the FPGA device along one of its major axes (e.g., the horizontally-extending x axis or the vertically-extending y axis). MaxL lines are also referred to as 'longlines'.

The programmably-configurable inter-connect resources can further include 'short-haul segments' which extend for lengths significantly less than those of the longlines. Short-haul segments generally terminate on both ends at inter-connect 'switch boxes'. The switch boxes provide programmably-definable inter-connections between terminal ends of short-haul connectors merging into the switch boxes.

Once a specific inter-connect line is 'consumed' for carrying a first signal, that inter-connect resource cannot be used to at the same time carry a second signal. Similarly, once a specific, logic function-providing resource is 'consumed' for carrying out a first logic function, that same logic function-providing resource cannot be used to at the same time carry out a completely different, second logic function.

FIG. 1 shows a view of an FPGA device 800 in accordance with the invention. The illustrated structure is formed on a monolithic integrated circuit. In one embodiment having a matrix of 20-by-20 VGBs, the integrated circuit is formed on a semiconductor die having an area of about 120,000 mils$^2$ or less. The integrated circuit includes at least five metal layers for forming inter-connect. The direct connect lines and longlines of the inter-connect are preferably implemented entirely by the metal layers so as to provide for low resistance pathways and thus relatively small RC time constants on such inter-connect lines.

Logic-implementing transistors of the integrated circuit have channel lengths of 0.35 microns or less. Amplifier output transistors and transistors used for interfacing the device to external signals may be larger, however.

FPGA device 800 is defined as a regular matrix. In the illustrated embodiment there are four super-VGBs in each row and also four super-VGBs in each column. Each super- VGB contains four VGBs. Each super-VGB is bounded by two horizontal and two vertical inter-connect channels (HICs and VICs). This combination of super-VGB and surrounding inter-connect resources is tiled as seen. The tiling provides adjacent pairs of inter-connect channels within the core of the device 800. Peripheral channels (HIC0, HIC7, VIC0, VIC7) are not paired. Switch matrix boxes (not shown) are formed at the intersections at the respective vertical and horizontal inter-connect channels.

The VGBs are numbered according to their column and row positions. The centrally-shared resources of each super-VGB are represented by the diamond-shaped hollow at the center of each super-VGB. Longline driving amplifiers are understood to occupy these diamond-shaped hollows to have their respective outputs coupling vertically and horizontally to the adjacent HICs and VICs of their respective super-VGBs.

Each super-VGB in FIG. 1 has four CBBs along each of its four sides. The four CBBs of each such inter-connect-adjacent side of the super-VGBs can store a corresponding four bits of data in their respective CSEs so as to define a nibble of data for output onto the adjacent inter-connect lines. Each VGB contains four CBBs which can acquire and process a nibble's worth of data.

A further description of the super-VGBs, VGBs, and inter-connect resources is provided by the above-identified patent application entitled, "VARIABLE GRAIN ARCHITECTURE FOR FPGA INTEGRATED CIRCUITS" which is incorporated herein by reference.

At the periphery of the device 800, there are three input/output blocks (IOBs) for each row of VGBs and for each column of VGBs. The IOBs in the illustrated embodiment are shown numbered from 1 to 96.

Figure 2:
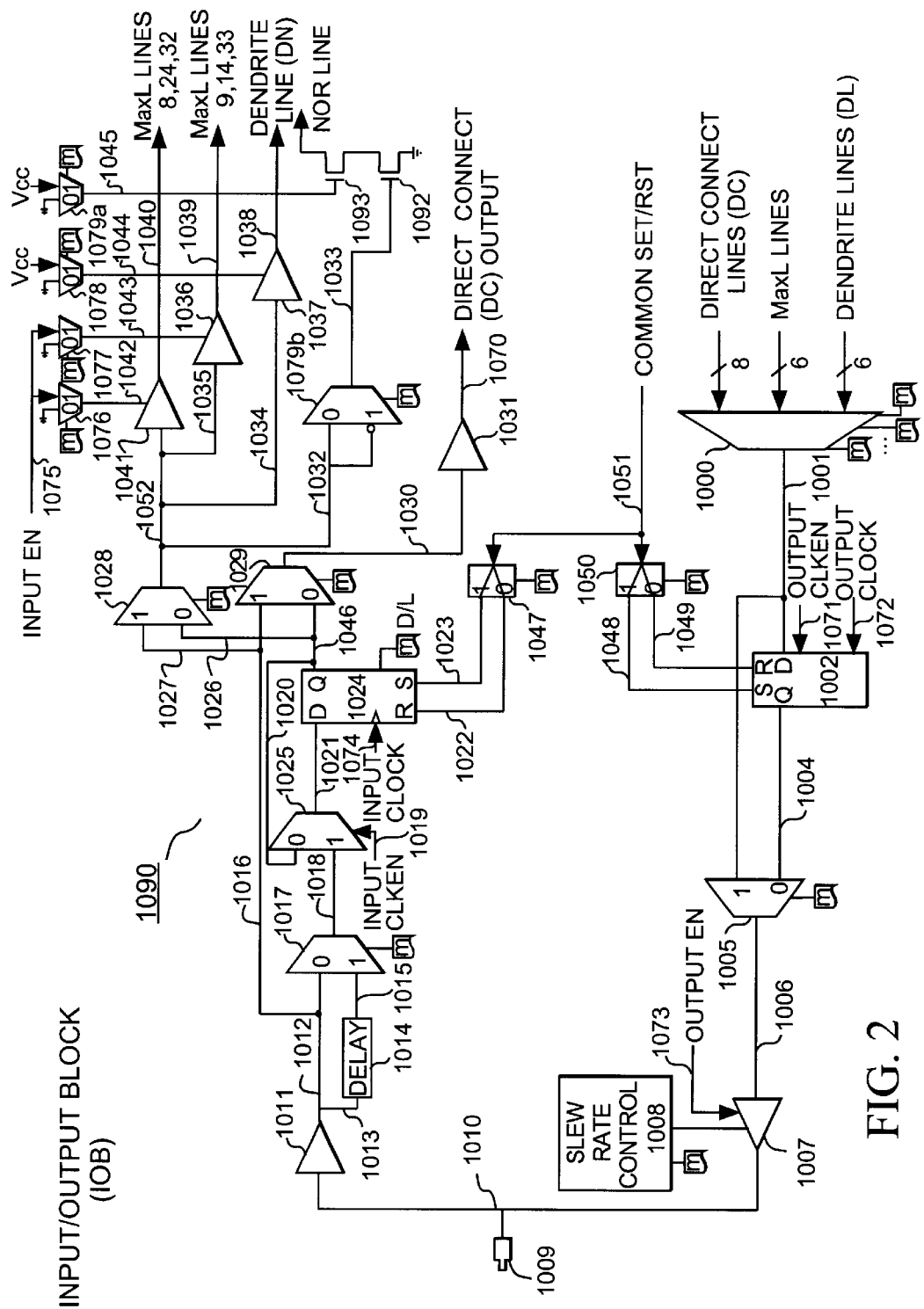
FIG. 2 illustrates an IOB architecture.

FIG. 2 illustrates an IOB 1090 corresponding to one of the 96 IOBs positioned on the periphery of FPGA device 800 illustrated in FIG. 1.

IOB 1090 provides a configurable intra-connection between the input/output pin 1009 and the inter-connect resources. The inter-connect resources may supply signals as inputs to IOB 1090. In particular, the inter-connect resources connected to input multiplexer 1000 include 8 direct connect (DC) lines, 6 MaxL lines, and 6 (DN) dendrite lines. The inter-connect resources connected to IOB outputs include two MaxL lines, one dendrite (DN) line, one NOR line, and one direct connect (DC) line. Line 1040 and 1039 are connected to MaxL lines. Line 1038 is connected to a dendrite (DN) line. Line 1033 controls a NOR line. Line 1070 is connected to a direct connect (DC) line.

Control input signals to IOB 1090 includes INPUT EN, INPUT CLOCK, INPUT CLKEN, OUTPUT EN, OUTPUT CLOCK, OUTPUT CLKEN and COMMON SET/RST signals. These control signals are obtained by IOB control multiplexers described in the above-identified application entitled "PROGRAMMABLE CONTROL MULTIPLEXING FOR INPUT/OUTPUT BLOCKs (IOBs) IN FPGA INTEGRATED CIRCUITS" incorporated herein by reference.

Figure 5:
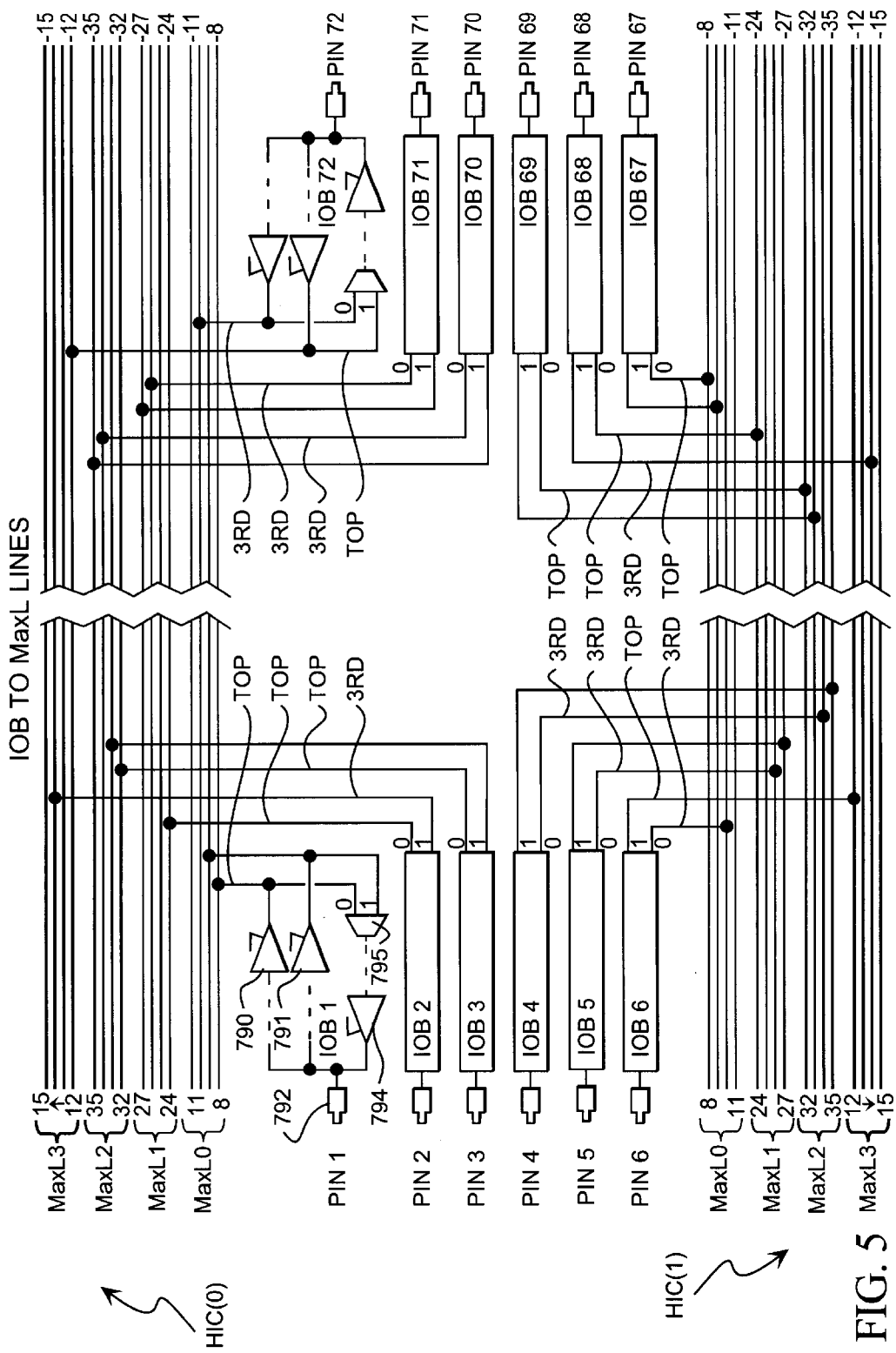
FIG. 5 illustrates connections between IOB outputs and MaxL lines.

An INPUT EN signal is input on line 1075 to multiplexers 1076 and 1077, which in turn generates signals on lines 1042 and 1043 enabling output drive amplifiers 1041 and 1036 to output signals on MaxL lines. In an embodiment, drivers 1041 and 1036 are tri-state drivers. The specific IOB outputs to MaxL line connections are illustrated in FIG. 5 and described in detail below. An INPUT CLOCK signal is input on line 1074 to input register/latch 1024 and is used to clock a configurable input register/latch 1024. A CLKEN signal is input on line 1019 to multiplexer 1025. A COMMON SET/RST signal is input on line 1051 to decoder 1047 and 1050 in order to set or reset configurable register/latch 1024. An OUTPUT CLOCK signal is input to output register 1002 on line 1072 in order to clock register 1002. A CLKEN signal is also input to register 1002 on line 1071. An OUTPUT EN signal is input on line 1073 to amplifier 1007 in order to enable signals output from amplifier 1007.

As illustrated in FIG. 2, many of the multiplexer and decoder outputs are selected by programmable memory bits in a configuration memory.

The input signals to IOB 1090 from inter-connect resources and dendrites are input to multiplexer 1000 which generates signals on line 1001 to output register 1002. Output register 1002 is clocked by an OUTPUT CLOCK signal on line 1072. The set and reset function of output register 1002 is selected by signals on lines 1048 and 1049, respectively. The COMMON SET/RST signal is input on line 1051 to decoder 1050, which then outputs a SET or RST signal on lines 1048 or 1049 in response to configuration memory programmed for decoder 1050 and COMMON SET/RST signal. The output of output register 1002 is supplied to line 1004. Line 1004 and line 1001 are connected to multiplexer 1005. The output of multiplexer 1005 is coupled to amplifier 1007 by line 1006. The amplifier 1007 has a slew rate control circuit 1008 as known in the art. The slew rate control circuit 1008 allows the output to either have a fast or slow rise time subject to the state of the memory bit controlling that function. Likewise, the amplifier 1007 has the OUTPUT EN signal supplied on line 1073.

The output of amplifier 1007 is connected to pin 1009 by line 1010.

An input signal to IOB 1090 may be received from pin 1009 and passed to amplifier 1011 on line 1010. The output of a signal from amplifier 1011 is input to multiplexer 1017 on line 1012 or to delay element 1014 on line 1013. In an embodiment, delay element 1014 is a chain of inverters with large channel lengths for pull up and pull down transistors. Delay element 1014 is used to delay incoming signals which may be generated by a peripheral device coupled to pin 1009. The delay may be necessary in order to provide approximately zero hold time for register/latch 1024. A global clock may be used as an INPUT CLOCK signal for register/latch 1024. The global clock signal may not reach register/latch 1024 before a data signal is provided to the D input of register/latch 1024. For example, the global clock may take approximately 2.3 nanoseconds to be provided to register/latch 1024 where a data signal from pin 1009 to register/latch 1024 may take approximately 0.7 nanoseconds. Thus, a delay 1014 is used to set up or time the data signal to register/latch 1024 when using a global clock. If the INPUT CLOCK is obtained externally or from an adjacent IOB, delay element 1014 may be bypassed. Likewise, if the input signal is intended to be a direct connect signal output on line 1070, delay element 1014 may be bypassed. Further, the use of Phase-Lock-Loop (PLL) and clock tree would eliminate the delay associated with a global clock signal and allow delay 1014 to be bypassed.

Signals from delay element 1014 are input to multiplexer 1017 on line 1015. The output of amplifier 1011 is also output on line 1016 to multiplexer 1029. The output of multiplexer 1017 is input to multiplexer 1025 on line 1018. A feedback signal may be provided as an input to multiplexer 1025 from configurable input register/latch 1024 on line 1020. Multiplexer 1025 is controlled by a CLKEN signal. The output of multiplexer 1025 is input to configurable input register/latch 1024 on line 1021.

Configurable input register/latch 1024, as with register 1002, is controlled by a SET and RST signal on lines 1023 and 1022, respectively. The input of configurable input register/latch 1024 is clocked by an INPUT CLOCK signal on line 1074. A COMMON SET/RST signal and predetermined configuration memory bit setting determining whether a signal is generated on line 1023 or line 1022.

Configurable input register/latch 1024 can be configured to operate either as a latch or a register, in response to a memory bit setting in configuration memory. When the input register/latch 1024 operates as a register, data at the input D is transferred to the output Q on the rising edge of the OUTPUT CLOCK signal on line 1072 or INPUT CLOCK signal on line 1074. When the input register/latch 1024 operates as a latch, any data change at D is seen at Q while the signal on line 1074 is high. When the signal on line 1074 returns to the low state, the output Q is frozen in the present state, and any change on D will not affect the condition of Q. A COMMON SET/RST signal may be generated from a VGB to all IOBs or to a set of IOBs in order to set or reset latch 1024. A COMMON SET/RST signal may also be generated by peripheral device coupled to the FPOA device.

The output of register/latch 1024 is input to multiplexer 1029 by line 1046. Multiplexer 1028 also has inputs from lines 1027 and 1026.

The IOB outputs to inter-connect resources are supplied on line 1052 from multiplexer 1028 and on line 1030 from multiplexer 1029. A NOR line may also be controlled by generating a signal on line 1032. MaxL, DN, or NOR output signals to predetermined interconnect lines are determined by signals from multiplexers 1076, 1077, and 1078, and 1079*a*. Configuration memories coupled to multiplexers 1076, 1077, and 1078 and the multiplexers inputs determine whether signals generated on lines 1042–45 enable output drive amplifiers 1041, 1036, and 1038. For example, an IOB output signal may be supplied to either MaxL lines 8, 24 or 32 (depending upon the particular IOB) on line 1040 from output drive amplifier 1041 in response to an inputted signal on line 1052 and a control signal on line 1042. Line 1042 is connected to the output of multiplexer 1076. Ground and line 1075 which may carry an INPUT EN signal are connected to multiplexer 1076 inputs. An IOB output signal may likewise be generated on either MaxL lines 9, 14, or 33 (depending upon the particular IOB), from output drive amplifier 1036. Output drive amplifier 1036 outputs a signal in response to a control signal on line 1043 and an input on line 1035. Likewise, control signals generated on line 1043 to output drive amplifier 1036 are generated by multiplexer 1077 which has two inputs, ground and an INPUT EN signal on line 1075.

An IOB output signal to a dendrite line is supplied from output drive amplifier 1037 on line 1038. Amplifier 1037 is enabled based on a control signal on line 1044. Line 1044 is coupled to drive amplifier 1037 and multiplexer 1078. The inputs of multiplexer 1078 include ground and a $V_{cc}$.

Figure 4:
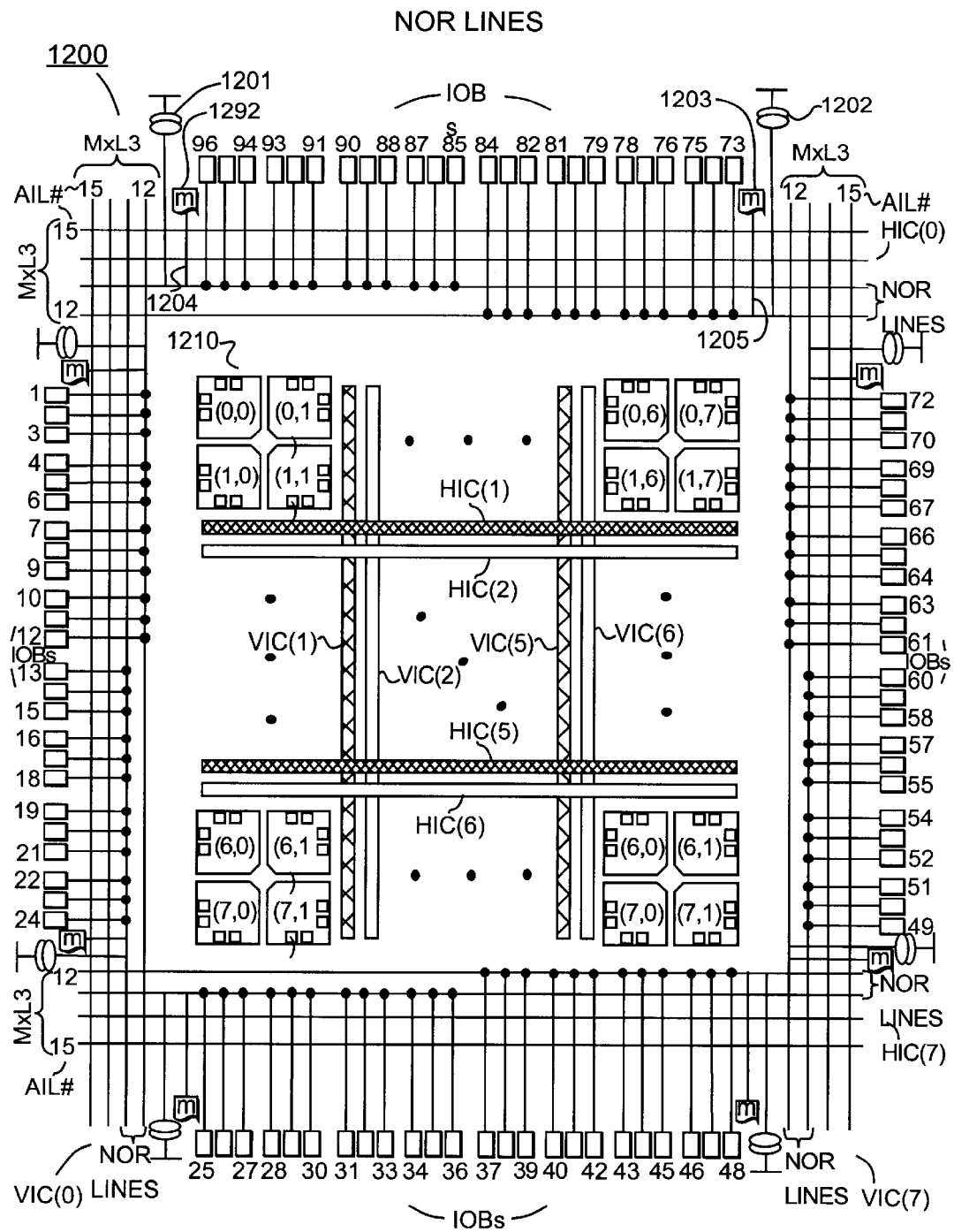
FIG. 4 illustrates IOB connections to NOR lines.

An IOB output signal controls an adjacent NOR line by generating a signal on line 1032 to multiplexer 1079. The output of polarity switching multiplexer 1079*b* is output to line 1033 which is coupled to a means for providing a ground path for current on the adjacent NOR line. In an embodiment, the means for providing a ground path includes transistors 1093 and 1092. Line 1033 is coupled to a the gate of transistor 1092. The drain of transistor 1092 is coupled to ground. The drain of transistor 1093 is coupled to the source of transistor 1092. The source of transistor 1093 is coupled to a NOR line. The gate of transistor 1093 is coupled to line 1045. Multiplexer 1079*a* supplies a control signal to line 1045 responses to inputs (ground, $V_{cc}$) and a configuration memory bit. A NOR line is illustrated in FIG. 4 and a detailed description of a NOR line operation is discussed in detail below.

A direct connect output from IOB 1090 is generated on line 1070 from amplifier 1031. Amplifier 1031 is connected to multiplexer 1029 by line 1030.

Figure 3A:
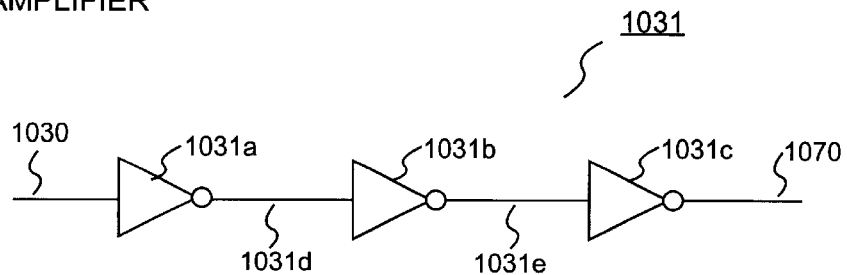
FIG. 3A is a schematic illustrating direct connect amplifier 1031 illustrated in FIG. 2.

FIG. 3A illustrates a schematic of direct connect amplifier 1031 illustrated in FIG. 2. Direct connect amplifier 1031 includes three inverters, 1031*a*, 1031*b*, and 1031*c*. The input of inverter 1031*a* is coupled to line 1030 and the output is coupled to line 1031*d*. The input of inverter 1031*b* is coupled to line 1031*d* and the output is coupled to line 1031*e*. The input of inverter 1031*c* is coupled to line 1031*e* and the output is coupled to line 1070. In an embodiment, inverters 1031*a*, 1031*b*, and 1031*c* are illustrated in FIG. 3E and described in detail below. A cross-section of the PMOS transistor and NMOS transistor provided in FIG. 3E is shown in FIG. 3F. In particular, specific polysilicon gate widths and lengths are described for providing the desired direct connect amplified signal for a predetermined direct connect length and/or capacitance.

Figure 3B:
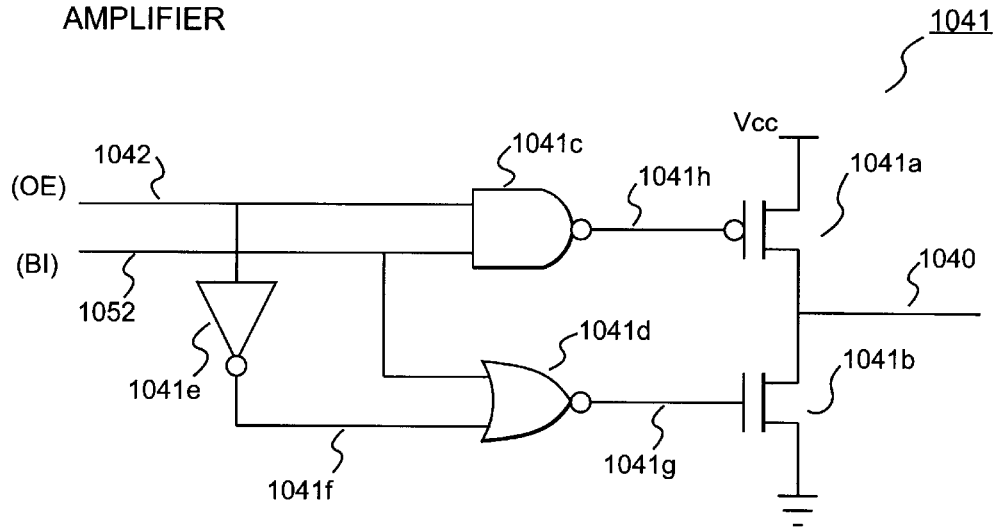
FIG. 3B is a schematic illustrating MaxL line amplifier 1041 illustrated in FIG. 2.

FIG. 3B illustrates MaxL line amplifier 1041 illustrated in FIG. 2. In alternate embodiments, the schematic illustrated in FIG. 3B and described below is also utilized in MaxL line amplifier 1036 and dendrite line amplifier 1038 shown in FIG. 2.

MaxL line amplifier 1041 includes PMOS transistor 1041*a* and NMOS transistor 1041*b*. The source of PMOS transistor 1041*a* is coupled to $V_{cc}$ while the drain of PMOS transistor 1041*a* is coupled to the drain of NMOS transistor 1041*b*. The drains of transistors 1041*a* and 1041*b* are coupled to line 1040 as illustrated in FIG. 3B and FIG. 2. Line 1040 is coupled to predetermined MaxL lines. The source of NMOS transistor 1041*b* is coupled to ground. An output of NAND gate 1041*c* is coupled to line 1041*h* which is coupled to the gate of PMOS transistor 1041*a*. One input of NAND gate 1041*c* is coupled to line 1042 while the other input is coupled to line 1052. Line 1042 carries an OUTPUT ENABLE ("OE") signal for enabling amplifier 1041 while line 1052 carries a BUF IN ("BI") signal input. The MaxL line output is provided on line 1040.

The output of NOR gate 1041*d* is coupled to line 1041*g* which is coupled to the gate of transistor 1041*b*. The 2-input NOR gate 1041*d* has respective inputs coupled to line 1052 and line 1041*f*. Inverter 1041*e* has an input coupled to line 1042 and an output coupled to line 1041*f*. The NAND gate 1041*c*, NOR gate 1041*d* and inverter 1041*e* are illustrated in FIGS. 3C, 3D, and 3E, respectively and are described below.

Figure 3C:
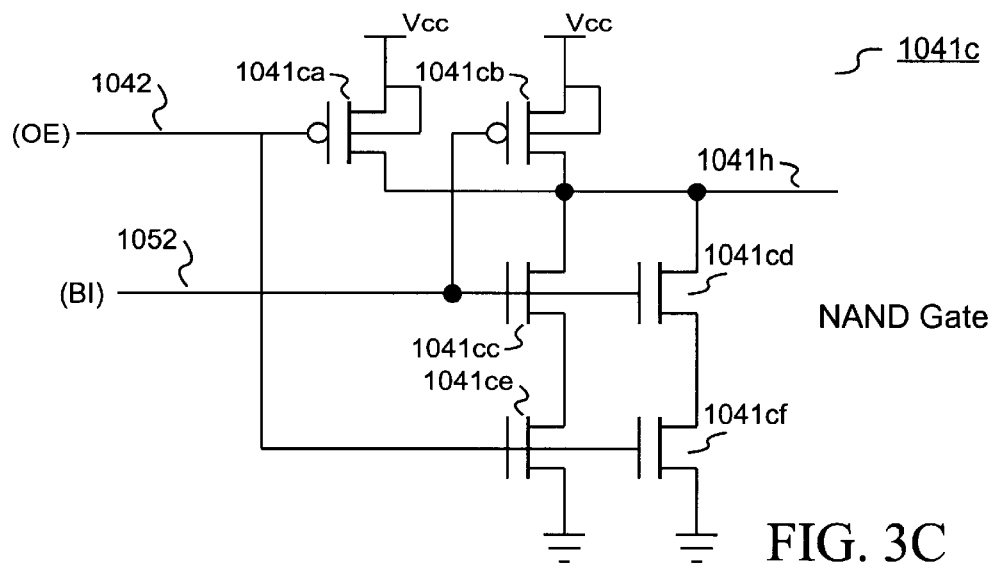
FIGS. 3C–E are a schematic illustrating the NAND gate, NOR gate and inverter illustrated in FIG. 3B.

FIG. 3C illustrates NAND gate 1041*c* illustrated in FIG. 3B. In an embodiment, NAND gate 1041*c* includes (1) two PMOS transistors 1041*ca* and 1041*cb* and (2) four NMOS transistors 1041*cc*, 1041*cd*, 1041*ee*, and 1041*ef*. The sources of PMOS transistors 1041*ca* and 1041*cb* are coupled to $V_{cc}$. The drains of transistors 1041*ca*, 1041*cb*, 1041*cc*, 1041*cd* are coupled to line 1041*h* which carries the output signal of NAND gate 1041*c*. The gate of transistor 1041*ca* is coupled to line 1042. The gates of transistors 1041*cb*, 1041*cc*, and 1041*cd* are coupled to line 1052. The gate of transistors 1041*ca*, 1041*ce*, and 1041*cf* are coupled to line 1042. The sources of transistor 1041*cc* and transistor 1041*cd* are coupled to the drains of transistor 1041*ce* and transistor 1041*cf*, respectively. The sources of transistor 1041*ce* and transistor 1041*cf* are coupled to ground.

In an alternate embodiment, a single transistor is used instead of the two transistors 1041*cc* and 1041*cd*. Likewise, in an alternate embodiment, a single transistor is used instead of transistor 1041ce and transistor 1041cf.

Figure 3D:
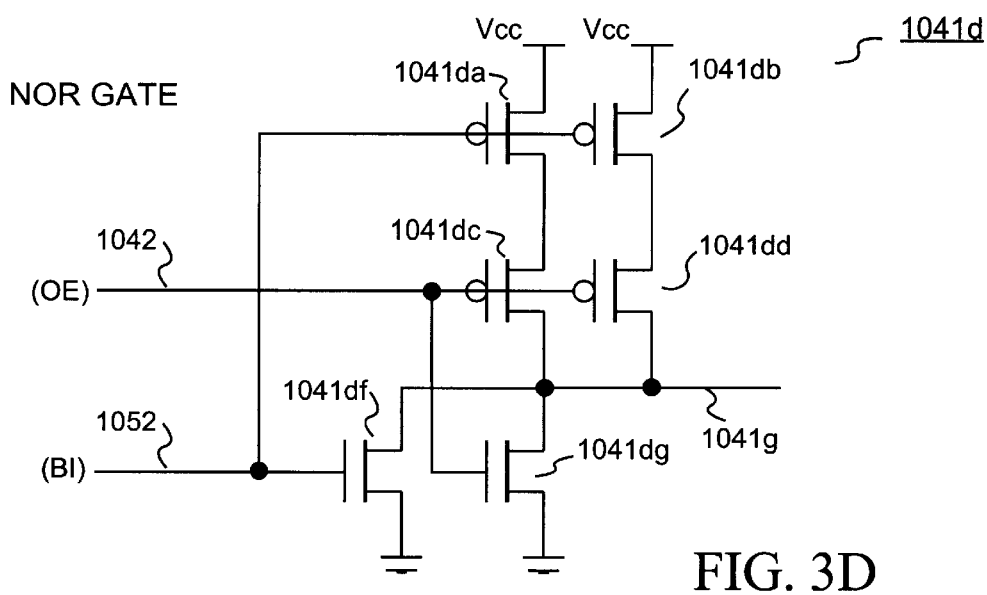
Figure 3E:
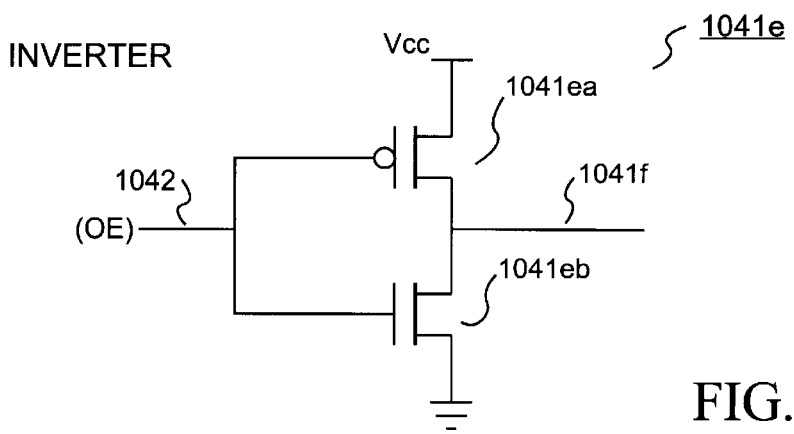
Figure 3F:
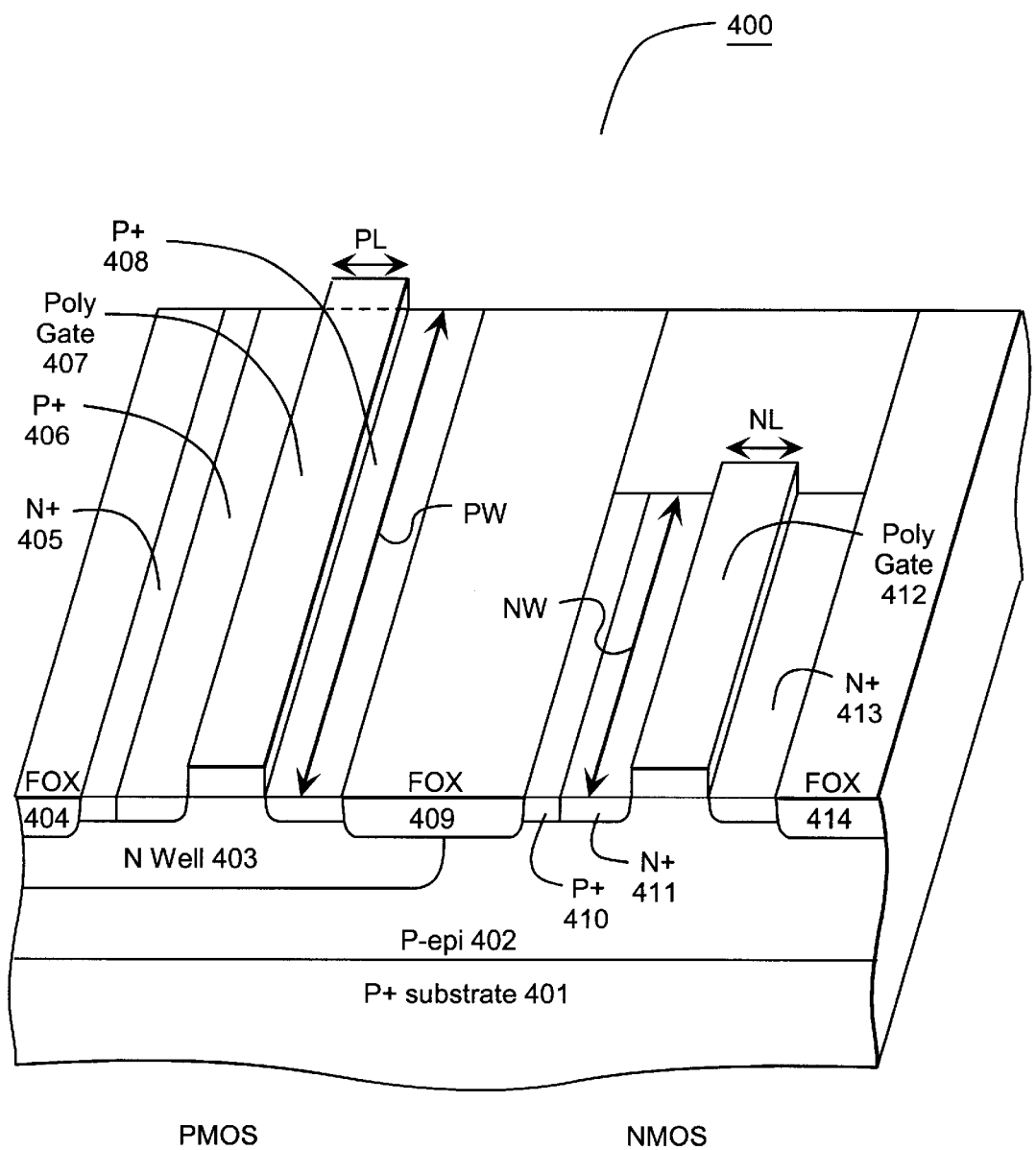
FIG. 3F illustrates a cross-section of a, semiconductor.

FIG. 3D illustrates the NOR gate 1041d illustrated in FIG. 3B. NOR gate 1041d includes (1) four PMOS transistors 1041da, 1041db, 1041dc, and 1041dd and (2) two NMOS transistors 1041df and 1041dg. The sources of transistors 1041da and 1041db are coupled to $V_{cc}$, respectively. The drains of transistor 1041da and transistor 1041db are coupled to the sources of transistor 1041dc and transistor 1041dd. The gates of transistors 1041da, 1041db, and 1041dd are coupled to line 1052. The gates of transistors 1041dc, 1041dd, and 1041dg are coupled to line 1042. NMOS transistor 1041dg and NMOS transistor 1041df have respective sources coupled to ground. The drains of transistors 1041df, 1041dg, 1041dc, and 1041dd are coupled to line 1041g which carries the output of NOR gate 1041d.

FIG. 3E illustrates inverter 1041e illustrated in FIG. 3B. Inverter 1041e includes PMOS transistor 1041ea and NMOS transistor 1041eb. The source of PMOS transistor 1041ea is coupled to $V_{cc}$, while the drain of transistor 1041ea is coupled to line 1041f. The drain of NMOS transistor 1041eb is coupled to 1041f. The source of NMOS transistor 1041eb is coupled to ground. The respective gates of transistor 1041ea and 1041eb are coupled to line 1042.

FIG. 3F illustrates semiconductor cross-section 400 having PMOS and NMOS transistors according to an aspect of the present invention. It should be understood by one of ordinary skill that FIG. 3F is used to illustrate polysilicon gate widths and lengths and other components, such as metal interconnects, are omitted in order to clearly illustrate the present invention. Similarly, one of ordinary skill in the art of semiconductor design would understand the various methods available for forming semiconductor 400.

Semiconductor substrate 400 includes P+ substrate 401. P− epi region 402 is formed over P+ substrate 401. N well region 403 is formed over P− epi 402 in order to construct a PMOS transistor. In an embodiment, the PMOS transistor illustrated in FIG. 3F is used to form the amplifiers illustrated in FIGS. 3AF. PMOS transistor includes field oxide region 404. The source of PMOS transistor is formed by the P+ region 406. The drain of the PMOS transistor is formed by P+ region 408. An N+ region 405 is formed between field oxide region 404 and P+ region 406. Polysilicon gate 407 is formed over N well region 403 and between P+ region 406 and P+ region 408. The polysilicon gate of the PMOS transistor is defined by a polysilicon width PW and a polysilicon gate length PL.

A field oxide region 409 separates the PMOS transistor from the NMOS transistor. The NMOS transistor includes a source formed by N+ region 411 and a drain formed by N+ region 413. A P+ region 410 is formed between field oxide region 409 and N+ region 411. Field oxide region 414 is formed adjacent N+ region 413. Similar to the polysilicon gate of the PMOS transistor, the NMOS polysilicon gate 412 has a width NW and a length NL. In an embodiment, the NMOS transistor illustrated in FIG. 3F is used to form the amplifier illustrated in FIGS. 3A–F.

The PMOS and NMOS transistors illustrated in FIG. 3F are sized in order to obtain a predetermined signal amplification for a particular amplifier in IOB 1090. For example, in an embodiment, MaxL amplifier 1041, MaxL amplifier 1036 and dendrite amplifier 1037 have a PW and NW of approximately 35 microns and 15 microns, respectively. Similarly, the PL and NL is approximately 0.25 microns. This relatively large amplifier is necessary in order to drive high capacitance long lines and dendrites. In an embodiment, a MaxL line is approximately 3700 microns in length for a 10×10 Super VGB FPGA. A dendrite line between I/O switch boxes is approximately 1000 microns in length. The respective capacitance are typically between approximately 3.6 pf and approximately 14 pf. The capacitance of a long line depends upon the number of connections to VGBs or PIPs activated in the input multiplexers to respective VGBs.

In contrast, the direct connect amplifier 1031 is relatively smaller than the MaxL and dendrite amplifiers. For example, the inverter 1031a has a PW and NW of approximately 3 microns and approximately 1.5 microns, respectively. Similarly, the PL and NL are approximately 0.25 microns. The inverter 1031b has a PW and an NW of approximately 8 microns and approximately 4 microns, respectively. Similarly, the PL and NL are approximately 0.25 microns. The inverter 1031c has a PW and NW of approximately 20 microns and approximately 10 microns, respectively. Similarly, the PL and NL are approximately 0.25 microns. The size and number of the inverters were chosen to efficiently and effectively provide signals on MaxL and dendrite lines. In an embodiment, a direct connect line length from an IOB to a VGB is approximately 750 microns. The typical capacitance is between approximately 0.5 pf and approximately 2.24 pf. The capacitance of the direct connect line depends upon the number of connections to VGBs used.

Thus, depending upon the length and capacitance of a particular interconnect resource, a predetermined amplifier size is used to provide a particular signal.

For example, a third sized amplifier may be used for the extended direct connect lines illustrated in FIG. 12 and described below. This sizing of amplifiers provides proper signal strength to internal resources without using larger amplifiers which would wastefully use more substrate surface area. Also, too large of an amplifier (large gate area) loads down the prior stage, yielding less than optimal performance. Furthermore, the symmetric nature of FPGA 800 allows for uniform sizing of particular amplifiers in all the IOBs. For example, a particular type of amplifier used on the left side (IOBs 1–24) of FPGA 800 is also used on the right side (IOBs 49–72) because all the IOBs around the periphery of FPGA 800 have access to identical interconnect resources.

FIG. 4 illustrates a NOR line architecture 1200. FIG. 4, as in FIG. 1, illustrates IOBs 1–96 arranged around the periphery of a plurality of VGBs and inter-connect resources 1210. Selected AIL lines in HIC(0), HIC(7), VIC(0), and VIC(7) are connected to respective IOBs as illustrated in FIG. 4.

MxL lines in vertical or horizontal inter-connect channels adjacent to the IOBs are used as NOR lines.

NOR lines are used to generate product terms. One application of a NOR line includes decoding an address generated from an external data/address bus coupled to I/O pins as described below. Two MxL3 lines are connected to IOB NOR line outputs. Specifically, IOBs 1–12 have NOR output lines connected to AIL #12 in VIC(0). Similarly, IOBs 13–24 have their NOR output lines connected to AIL #13 in VIC(0).

IOBs 25–36 have respective NOR output lines connected to AIL #13. IOBs 37–48 have NOR output lines connected to AIL #12 in HIC(7). IOBs 49–60 have NOR output lines connected to AIL #13. IOBs 61–72 have NOR output lines connected to AIL #12 in VIC(7). IOBs 7325 84 have NOR output lines connected to AIL #12. IOBs 85–96 have NOR output lines connected to AIL #13 in HIC(0).

AILs #12 and 13 in HIC(0), HIC(7), VIC(0), and VIC(7) are MxL3 lines which may be used as dedicated NOR lines.

Current sources, such as current sources 1201 and 1202 are coupled to AIL #13 and AIL #12 respectively. Other current sources are coupled NOR lines in VIC(0), HIC(7) and VIC(7). A NOR control line is associated with each NOR line. For example, control line 1204 is coupled to a NOR line (AIL #13) and a NOR line configuration memory bit 1292. Likewise, NOR control line 1205 is coupled to a NOR line (AIL #12) and a NOR control configuration memory bit 1203. If the NOR control line configuration memory bit is cleared, the NOR control line associated with that configuration memory bit is high and the associated NOR line behaves like a MxL line. If the configuration memory bit is programmed, the NOR control line goes low and a current source such as current source 1201 or 1202 is connected to the respective NOR line. The NOR line then behaves like a NOR gate, for example, the NOR line is pulled high if none of the transistors (such as transistors 1093 and 1092 illustrated in FIG. 2) connected to the NOR line are on and thus pull the NOR line low. Thus, a set of IOBs, such as IOBs 1–12, may be coupled to an external peripheral address/data bus. An address may be generated on the pins associated with IOBs 1–12. The IOBs thus may turn on respective IOB transistor gates 1092 depending upon the signal generated on line 1033 and associated configuring memory bit settings illustrated in FIG. 2.

The NOR lines are positioned in an inter-connect channel adjacent to the IOBs in order to reduce signal propagation delays which may occur if the NOR lines were positioned further away from the IOBs. Also, using two separate NOR lines per side of IOBs, for example IOBs 1–12 and 13–24, also reduces capacitance associated with a NOR line and thus further reduces signal propagation delays. The two NOR lines may also be used together or separately for improved flexibility. Typically, the capacitance of a NOR line is slightly larger than the capacitance of a MaxL line. NOR lines have additional drivers coupled to the lines. For example, pull down transistor 1093 of FIG. 2 will add capacitance. MaxL lines (MxL3) were also selected for NOR lines because the MaxL lines do not have to travel through capacitive loaded switchboxes.

An embodiment for controlling a current source, such as current source 1201, coupled to a NOR line which provides reduced power consumption (zero power) is described in the above-identified patent application entitled, "MULTIPLE INPUT ZERO POWER AND/NOR GATE FOR USE WITH A FIELD PROGRAMMABLE GATE ARRAY (FPGA)", incorporated by reference herein.

FIG. 5 illustrates the programmably configured connections between IOB outputs and inter-connect channel MxL lines. FIG. 5, as in FIG. 4, illustrates a portion of the AILs associated with horizontal inter-connect channels. Two sets of 6 IOBs corresponding to IOBs 1–6 and 72–67 shown in FIG. 1 is illustrated in FIG. 5. FIG. 5 illustrates how IOB's interface with the MaxL lines, and in particular the TOP set of AIL's #8, #24, #32 and #12; and the 3RD set of AIL's #10, #26, #34 and #14.

As seen in FIG. 5, each IOB such as IOB 1 (at the top, left) includes two longline tri-state drivers 790 and 791 (corresponding to amplifiers 1041 and 1033 illustrated in FIG. 2) for driving a respective pair of MaxL lines. The illustrated tristate drivers 790 and 791 for example, respectively drive TOP AIL #8 and 2ND AIL #9. Input signals of the respective two longline driving tristate drivers, 790 and 791, may be configurably derived from a number of sources including external I/O pin 1 of the FPGA device 800. (Other sources include a bypassable and serially-coupled configurable register/latch as illustrated in FIG. 2 within each IOB.)

Each IOB such as IOB 1 further includes a pin-driving tri-state driver (with configurably-variable slew rate) such as shown at 794 (corresponding to amplifier 1007 in FIG. 2). Input signals of the pin-driving tristate driver 794 may be configurably derived from a number of sources including from user-configurable multiplexer 795 (corresponding to multiplexer 1000 in FIG. 2). Two of the selectable inputs of multiplexer 795 are coupled to the same two longlines driven by that same IOB. In the case of IOB 1 for example, that would be TOP AIL #8 and 2ND AIL #9.

The remaining IOB's shown in FIG. 5 have similar internal structures as illustrated in FIG. 2 and described above. As seen, at the left side of the FPGA device 800 between even-numbered HIC(0) and odd-numbered HIC(1), there are provided six IOB's respectively identified as IOB 1 through IOB 6. At the right side of the FPGA device 800 there are further provided six more IOB's respectively identified as IOB 72 through IOB 67. The external I/O pins are similarly identified as PIN 72 through PIN 67 on the right side and as PIN 1 through PIN 6 on the left side. The same connection pattern repeats between every successive set of even and odd-numbered HIC's.

FIG. 5 may be rotated ninety degrees to thereby illustrate the IOB-to-MaxL lines connectivity pattern for the VIC's as well. (References to horizontal lines will of course be changed to vertical and references to left and right IOB's will of course be changed to top and bottom.)

On the left side, IOB 1, IOB 2 and IOB 3 collectively provide bidirectional coupling at least to 3 longlines (AIL's #8, #24, #32) and 1 longline (AIL #14) in the adjacent even-numbered HIC(0). On the right side, IOB 72, IOB 71 and IOB 70 collectively provide bidirectional coupling at least to 3 longlines (AIL's #10, #26, #34) and 1 longline (AIL #12) in the adjacent and same even-numbered HIC(0). The combination of the six IOB's of HIC(0) therefore allow for bidirectional coupling of nibble-wide data either to the first set (AIL's #8, #24, #32 and #12) and/or to the second set (AIL's #10, #26, #34 and #14).

As seen in the bottom half of FIG. 5, on the left side, IOB 4, IOB 5 and IOB 6 collectively provide bidirectional coupling at least to 3 longlines (AIL's #10, #26, #34) and 1 longline (AIL #12) in the adjacent odd-numbered HIC(1). On the right side, IOB 67, IOB 68 and IOB 69 collectively provide bidirectional coupling at least to 3 longlines (AIL's #8, #24, #32) and 1 longline (AIL #14) in the same odd-numbered HIC(1). The combination of the six IOB's of HIC(1) therefore allow for bidirectional coupling of nibble-wide data either to the first set (AIL's #8, #24, #32 and #12) and/or to the second set (AIL's #10, #26, #34 and #14) of the odd-numbered, adjacent HIC.

This IOB-to-MaxL line architecture enables multiple FPGA devices to be coupled to form a bus including the multiple sets of MaxL lines. A first set of MaxL lines of a first FPGA device may be coupled through IOBs to a second FPGA device having a second set of MaxL lines. The first FPGA may be configured to act as a bus controller or master.

Aside from direct connect wires, IOBs may be further coupled to the super-VGBs of the device by 2xL, 4xL, 8xL lines of the adjacent HICs. Coupling between the IOBs and the 2xL, 4xL, 8xL lines of adjacent HICs may be provided through a configurable dendrite structure described below.

In an embodiment, each IOB in FPGA device 800 is connected to drive (write) and read a predetermined MaxL line.

Figure 7:
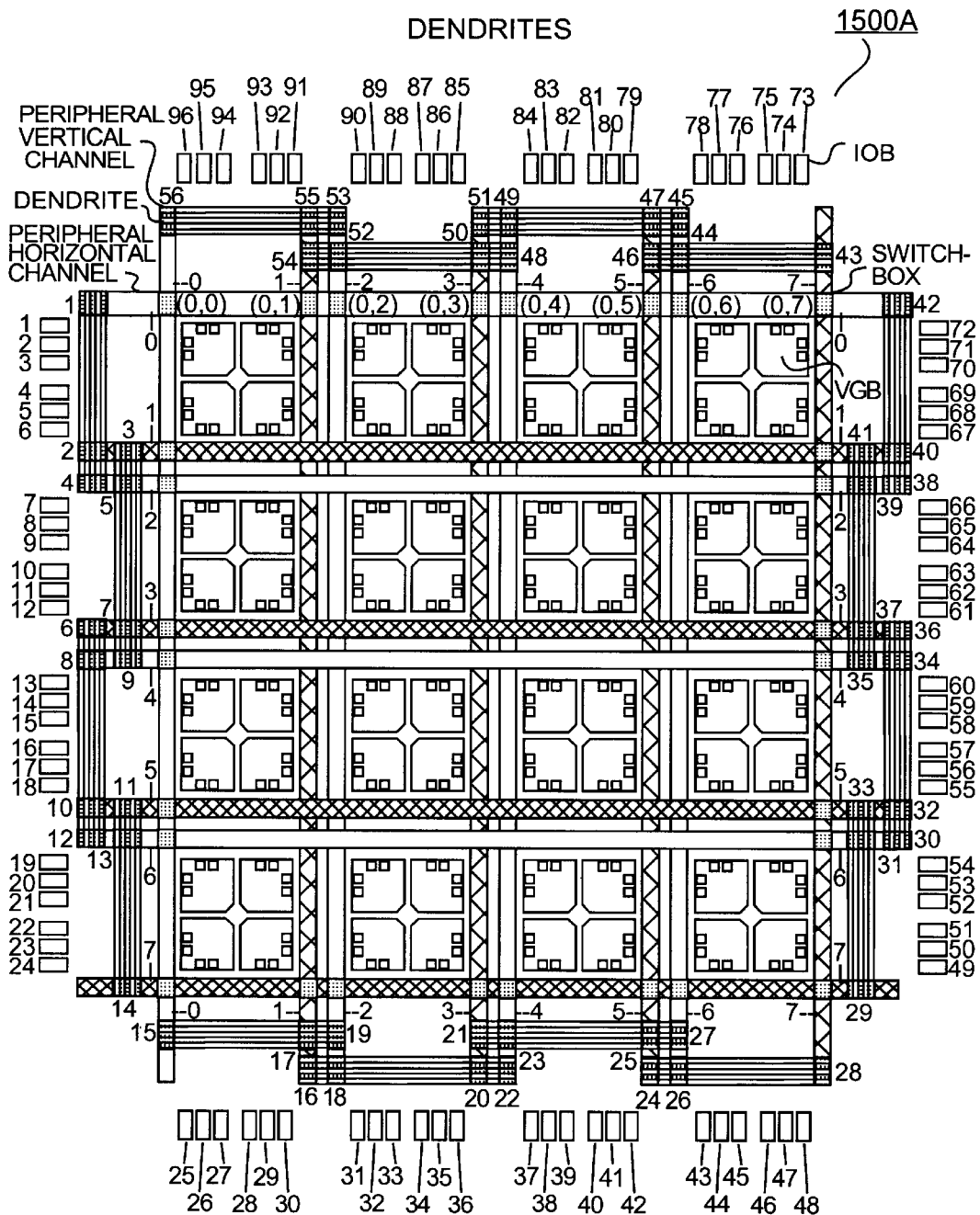
FIG. 7 illustrates a dendrite overview architecture in a FPGA device as illustrated in FIG. 1.

A dendrite architecture 1500A is positioned between IOBs 1–96 and inter-connect channels HIC(O), HIC(7), VIC(0), and VIC(7) as illustrated in FIG. 7. The dendrite architecture 1500A includes 56 I/O switchboxes positioned between IOBs and VGBS. The 56 I/O switchboxes are coupled to dendrite lines and are coupled to the inter-connect channels to form dendrites. FIG. 7 also illustrates switchboxes, such as SwBxs (0,0), (0,1), (0,2), (0,3), (0,4), (0,5), (0,6) on HIC(1).

The dendrite architecture advantageously routes signals between IOBs without utilizing general inter-connect resources. For example, without the use of dendrites, a signal transferred from a first IOB to a second IOB may have to be routed through a general inter-connect resource, such as a HIC, to a VGB, then back out through general inter-connect resources to the second IOB. This signal routing scheme consumes general inter-connect resources and VGB input/outputs which could be otherwise used.

Further, this routing scheme increases signal propagation times. The signal would have to travel through capacitance and resistance loaded switchboxes and VGBs increasing signal propagation times.

Another advantage of the dendrites architecture includes enhanced flexibility for the FPGA configured software. The dendrite architecture allows the FPGA configured software to reroute I/O signals from fixed pins to a collection of circuit chunks placed in VGBs. Without the dendrite architecture, the FPGA configuring software may have to reposition circuit chunks to different VGBs in the FPGA device in order to accommodate the I/O signals from fixed pins.

Figure 6:
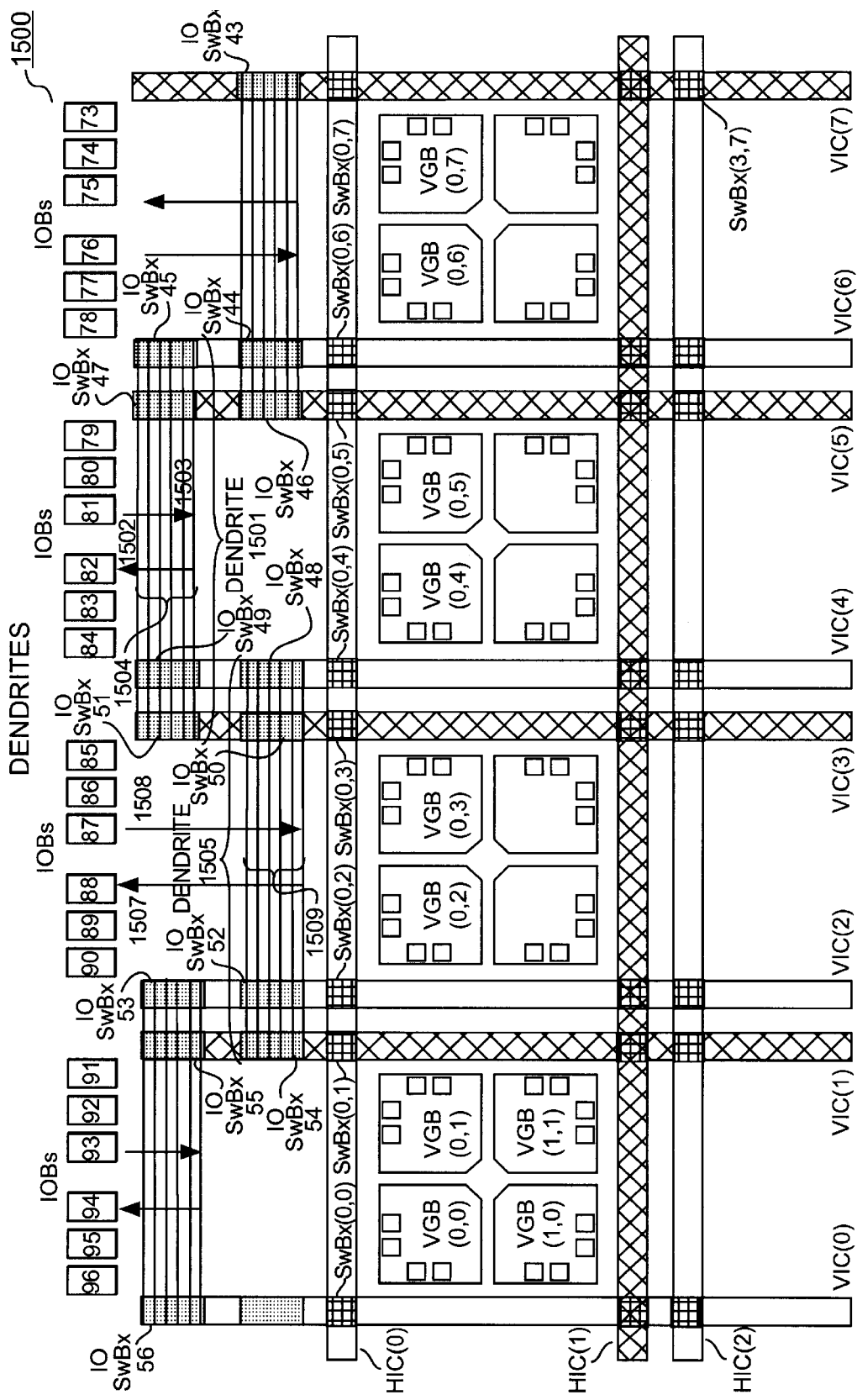
FIG. 6 illustrates a dendrite architecture.

Dendrite architecture 1500 illustrated in FIG. 6 includes a series of dendrites. For example, dendrite 1501 includes I/O switchboxes I/O SwBx 51, I/O SwBx 49, I/O SwBx 47 and I/O SwBx 45, six dendrite lines identified as reference number 1504 and dendrite input and output lines to IOBs illustrated as arrows 1502 and 1503. I/O SwBx 51 is coupled to VIC(3) and I/O SwBx 49 is coupled to VIC(4). Similarly, I/O SwBx 47 is coupled to VIC(5) and I/O SwBx 45 is coupled to VIC(6). Dendrite lines 1504 are programmably configured to I/O SwBx 51, I/O SwBx 49, I/O SwBx 47, and I/O SwBx 45. Input and output dendrite lines of IOBs 84-79, illustrated as arrows 1502 and 1503, are connected to dendrite lines 1504.

Further details on dendrites and I/O switch boxes are provided in the above-identified application entitled "INPUT/OUTPUT BLOCK (IOB) CONNECTIONS TO MAXL LINES, NOR LINES AND DENDRITES IN FPGA INTEGRATED CIRCUITS" incorporated herein by reference.

An adjacent dendrite 1505 to dendrite 1501 is connected to dendrite input and output lines of IOBs 85–90. Dendrite 1505 is shifted toward the VGBs relative to dendrite 1501. Dendrite 1505 includes I/O SwBxs 54, 52, 50 and 48, dendrite lines 1509, and dendrite input and output lines represented by arrows 1507 and 1508. I/O SwBx 50 is coupled to VIC(3). I/O SwBx 48 is coupled to VIC(4). Similarly, I/O SwBxs 54 and 52 are coupled to VIC(1) and (2), respectively. Dendrites 1501 and 1505 may be similarly positioned along the periphery of FPGA device 800 as illustrated in FIG. 7.

Figures 8, 9:
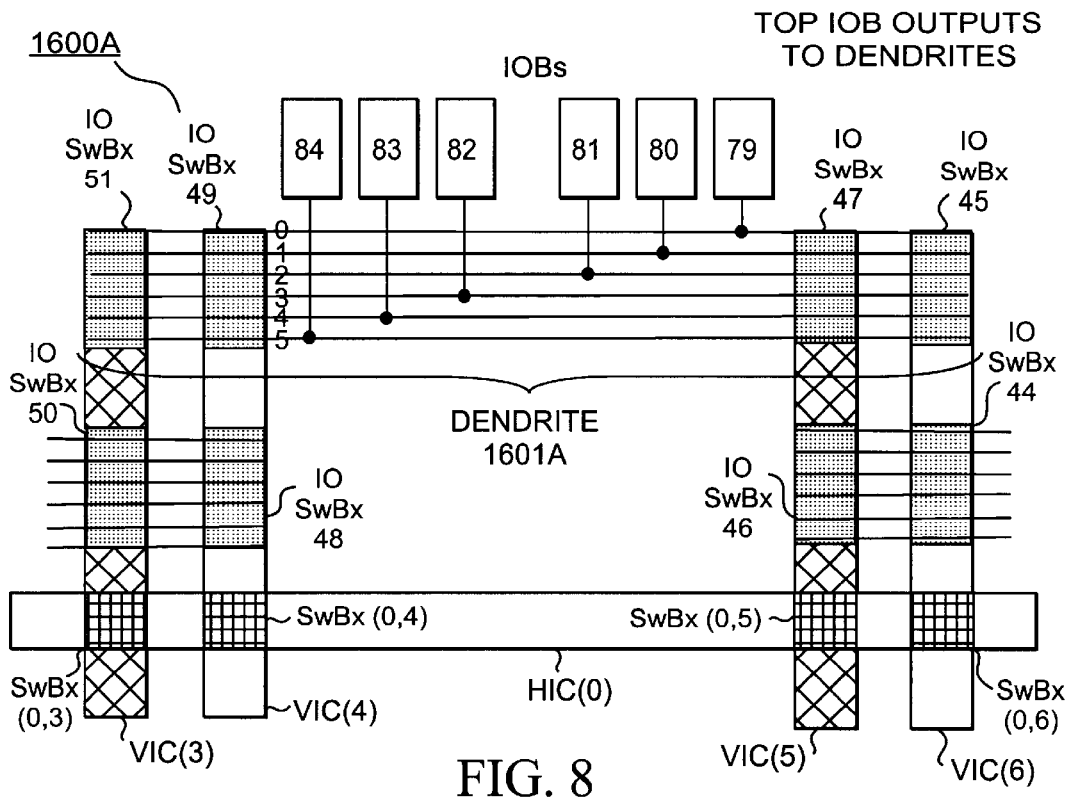
FIGS. 8 and 9 illustrate connections between top and bottom IOB outputs and dendrite lines.

FIG. 8 illustrates the connections between top IOB dendrite outputs and dendrite lines 0–5 in dendrite 1601A. Dendrite 1601A includes I/O SwBx 51, I/O SwBx 49, I/O SwBx 47, and I/O SwBx 45. I/O switchboxes are illustrated in detail in FIGS. 20–23 and described in detail below. I/O SwBx 51 is coupled to VIC(3). I/O SwBx 49 is coupled to VIC(4). I/O SwBx 47 is coupled to VIC(5). I/O SwBx 45 is coupled to VIC(6). Dendrite lines 0–5 are programmably configured to I/O SwBx 51, I/O SwBx 49, I/O SwBx 47 and I/O SwBx 45. A dendrite output line for IOB 84 is connected to dendrite line 5. A dendrite output line for IOB 83 is connected to dendrite line 4. A dendrite output line for IOB 82 is connected to dendrite line 3. A dendrite output line for IOB 81 is connected to dendrite line 2. A dendrite output line for IOB 80 is connected to dendrite line 1. A dendrite output line for IOB 79 is connected to dendrite line 0. Amplifier 1038 illustrated in FIG. 2 is used to drive the dendrite line between I/O SwBx and along dendrites at a specific side of FPGA 800. For example, the dendrite amplifier associated with IOB 80 drives dendrite line 1 which may be further coupled to dendrite lines associated with IOBs 96-85 and 78-73. In an embodiment, the dendrite line (or collection of dendrite lines between I/O SwBx 56–43)associated with IOBs 96-73 is approximately 1000 microns. Portions of adjacent dendrites are also illustrated in FIG. 8. In particular, a portion of left adjacent dendrite including I/O SwBxs 50 and 48 is illustrated as well as a right adjacent dendrite including I/O SwBxs 46 and 44. Switchboxes SwBx (0,3), SwBx (0,4), SwBx (0,5), and SwBx (0,6) are coupled to HIC(O) in order to route signals between HIC(0) and VIC(3), VIC(4), VIC(5), and VIC(6).

FIG. 9 illustrates the connections between bottom IOB dendrite outputs and dendrite lines 0–5 in dendrite 1601B. Dendrite 1601B includes I/O SwBx 20, I/O SwBx 22, I/O SwBx 24, and I/O SwBx 26. I/O SwBx 20 is coupled to VIC(3). I/O SwBx 22 is coupled to VIC(4). I/O SwBx 24 is coupled to VIC(5). I/O SwBx 26 is coupled to VIC(6). Dendrite lines 0–5 are programmably configured to I/O SwBx 20, I/O SwBx 22, I/O SwBx 24 and I/O SwBx 26. A dendrite output line for IOB 37 is connected to dendrite line 5. A dendrite output line for IOB 38 is connected to dendrite line 4. A dendrite output line for IOB 39 is connected to dendrite line 3. A dendrite output line for IOB 40 is connected to dendrite line 2. A dendrite output line for IOB 41 is connected to dendrite line 1. A dendrite output line for IOB 42 is connected to dendrite line 0. Portions of adjacent dendrites are also illustrated in FIG. 9. In particular, a portion of left adjacent dendrite including I/O SwBxs 21 and 23 is illustrated as well as a right adjacent dendrite including I/O SwBxs 25 and 27. Switchboxes SwBx (7,3), SwBx (7,4), SwBx (7,5), and SwBx (7,6) are coupled to HIC(7) in order to route signals between HIC(7) and VIC(3), VIC(4), VIC (5), and VIC(6).

A similar dendrite architecture may be used for the right and left IOBs.

Figure 10:
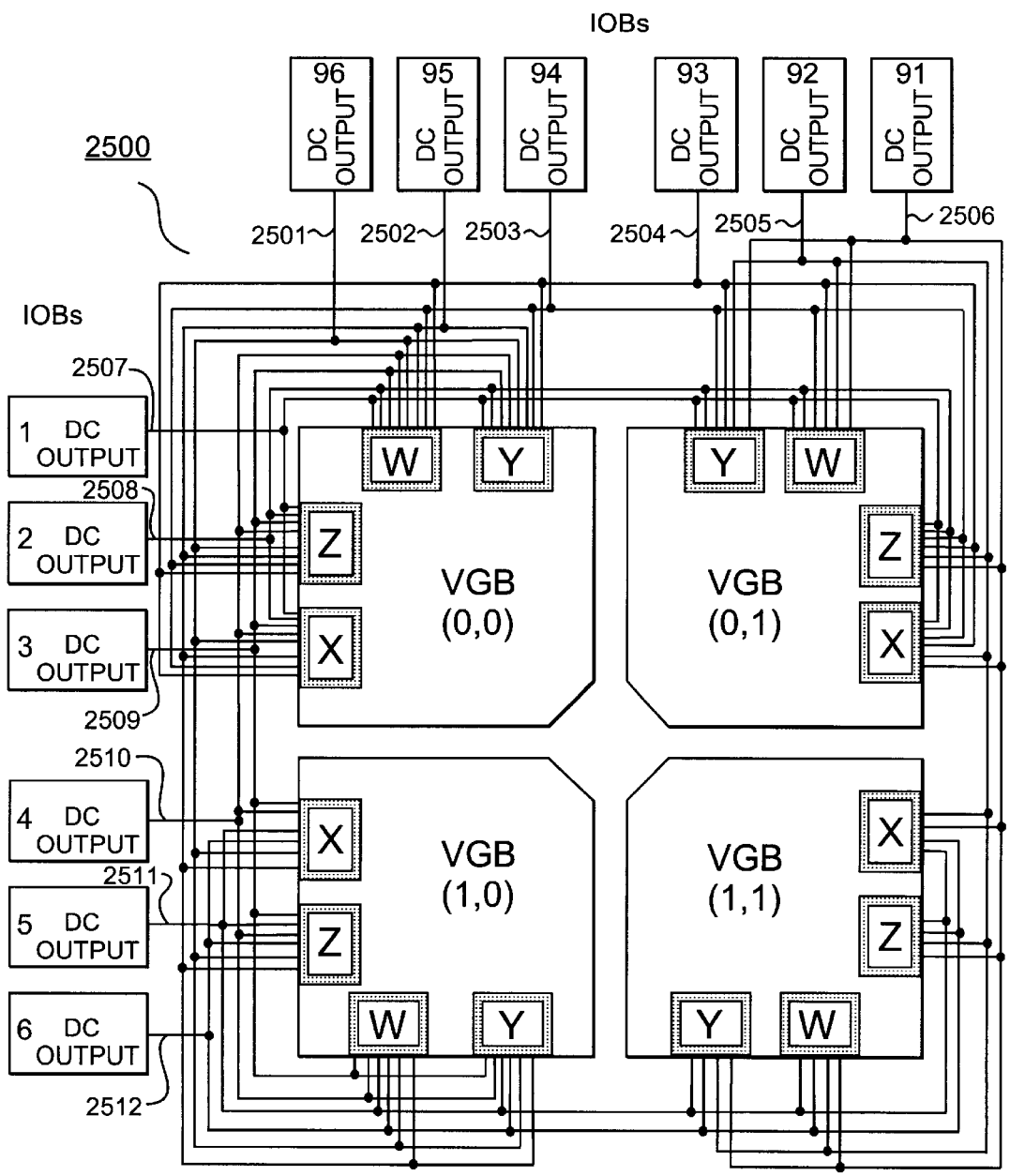
FIG. 10 illustrates a direct connect architecture between corner IOB direct connect outputs and corner super-VGB inputs.
Figure 11:
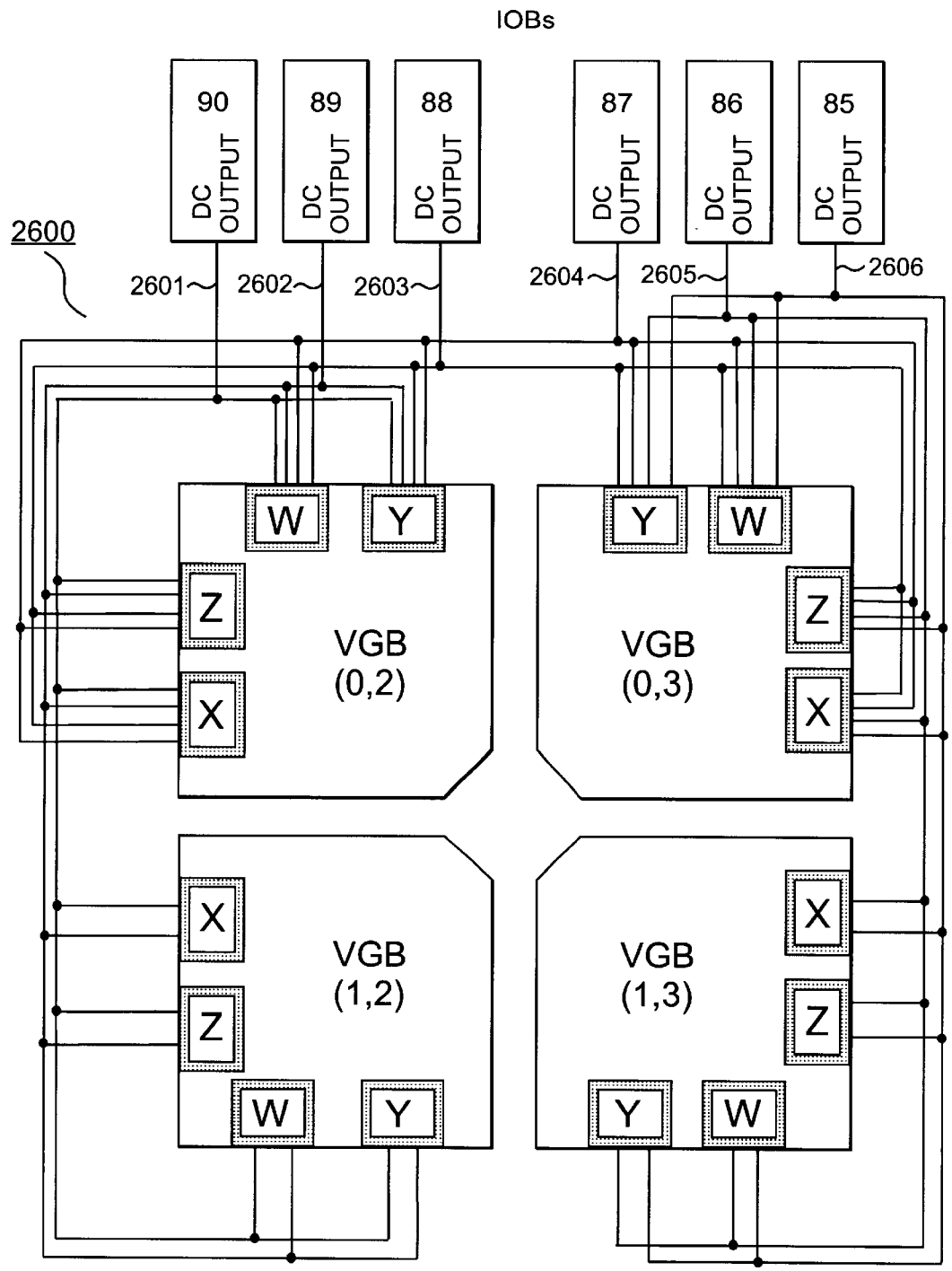
FIG. 11 illustrates a direct connect architecture between non-corner IOB direct connect outputs and non-corner super-VGB inputs.

FIGS. 10–11 illustrate a detailed direct connect architecture between adjacent IOBs and super-VGBs.

FIG. 10 illustrates a direct connect architecture 2500 between corner IOBs direct connect outputs and a corner super-VGB, including VGBs (0,0), (0,1), (1,0), and (1,1). FIG. 10 illustrates an expanded view of the upper lefthand corner of FIG. 1. In particular, FIG. 10 illustrates the direct connect output connections between IOBs 1–6 and 91–96 to VGBs (0,0), (0,1), (1,0), (1,1).

Direct connect outputs from corner IOBs 1–6 and 96–91 are connected to CBBs Y, W, Z, and X in VGBs (0,0), (0,1), (1,0), (1,1) by direct connect lines 2501–2512. A direct connect output of IOB 1 is connected to direct connect line 2507. In an embodiment, direct connect line 2507 has a length of approximately 750 microns and has a capacitance of between approximately 0.5 pf and approximately 2.24 pf. The capacitance of the direct connect line depends upon the number of connections to VGBs used. Direct connect line 2507 is connected to CBBs Y, W, Z, and X in VGB (0,0) and (0,1). A direct connect output of IOB 2 is connected to direct connect line 2508. Direct connect line 2508 is connected to CBBs Y, W, Z, and X in VGB (0,0) and (0,1). A direct connect output of IOB 3 is connected to direct connect line 2509. Direct connect line 2509 is connected to CBBs Y, W, Z, and X in VGBs (0,0) and (1,0). A direct connect output of IOB 4 is connected to direct connect line 2510. Direct connect line 2510 is connected to CBBs Y, W, Z, and X in VGBs (0,0) and (1,0). A direct connect output of IOB 5 is connected to direct connect line 2511. Direct connect line 2511 is connected to CBBs Y, W, Z, and X in VGBs (1,0) and (1,1). A direct connect output of IOB 6 is connected to direct connect line 2512. Direct connect line 2512 is connected to CBBs Y, W, Z, and X in VGBs (1,0) and (1,1). Direct connect output in IOB 91 is connected to direct connect line 2506. Direct connect line 2506 is connected to CBBs Y, W, Z, and X in VGBs (0,1) and (1,1). A direct connect output in IOB 92 is connected to direct connect line 2505. Direct connect line 2505 is connected to CBBs Y, W, Z, and X in VGBs (0,1) and (1,1). A direct connect output in IOB 93 is connected to direct connect 2504. Direct connect 2504 is connected to CBBs Y, W, Z, and X in VGBs (0,0) and (0,1). Direct connect output in IOB 94 is connected to direct connect line 2503. Direct connect line 2503 is connected to CBBs Y, W, Z, and X and VGBs (0,0) and (0,1). A direct connect output in IOB 95 is connected to direct connect line 2502. Direct connect line 2502 is connected to CBBs Y, W, Z, and X in VGBs (0,0) and (1,0). A direct connect output in IOB 96 is connected to direct connect line 2501. Direct connect line 2501 is connected to CBBs Y, W, Z, and X in VGBs (0,0) and (1,0).

A similar direct connect architecture is repeated for the other corner IOBs illustrated in FIG. 1. For example, a similar direct connect architecture may be used for the corner IOBs 67–78, 43–54 and 19–30 with respective VGBs (0,6), (0,7), (1,6), (1,7); (6,6), (6,7), (7,6), (7,7); and (6,0), (6,1), (7,0), (7,1), respectively.

FIG. 11 illustrates a direct connect architecture 2600 between non-corner IOB direct connect outputs and non-corner VGBs. FIG. 11 corresponds to IOBs 85–90 and VGBs (0,2), (0,3), (1,2) and (1,3) illustrated in FIG. 8. Direct connect outputs of IOBs 85–90 are connected to CBBs Y, W, Z, and X in VGBs (0,2), (0,3), (1,2) and (1,3). Specifically, a direct connect output of IOB 90 is connected to direct connect line 2601. In an embodiment, direct connect line 2601 has a length of approximately 750 microns and has a capacitance of between approximately 0.5 pf and approximately 2.24 pf.

The capacitance of the direct connect line depends upon the number of connections to VGBs used. Direct connect line 2601 is connected to CBBs Y, W, Z, and X in VGBs (0,2) and (1,2). A direct connect output in IOB 89 is connected to direct connect line 2602. Direct connect line 2602 is connected to CBBs Y, W, Z, and X in VGB (0,2) and (1,2). A direct connect output in IOB 88 is connected to direct connect line 2603. Direct connect line 2603 is connected to CBBs Y, W, Z, and X in VGBs (0,2) and (0,3). A direct connect output in IOB 87 is connected to direct connect line 2604. Direct connect line 2604 is connected to CBBs Y, W, Z, and X in VGBs (0,2) and (0,3). A direct connect output in IOB 86 is connected to direct connect line 2605. Direct connect line 2605 is connected to CBBs Y, W, Z, and X in VGBs (0,3) and (1,3). A direct connect output in IOB 85 is connected to direct connect line 2606. Direct connect line 2606 is connected to CBBs Y, W, Z, and X in VGBs (0,3) and (1,3).

A similar direct connect architecture is repeated with other non-corner IOBs. For example, IOBs 79–84 and VGB (0,4), (0,5), (1,4), and (1,5) may have a similar direct connect architecture. Further, IOBs 718, 31–42 and 55–66 may have a similar direct connect architecture with respective adjacent non-corner VGBs.

Figure 12:
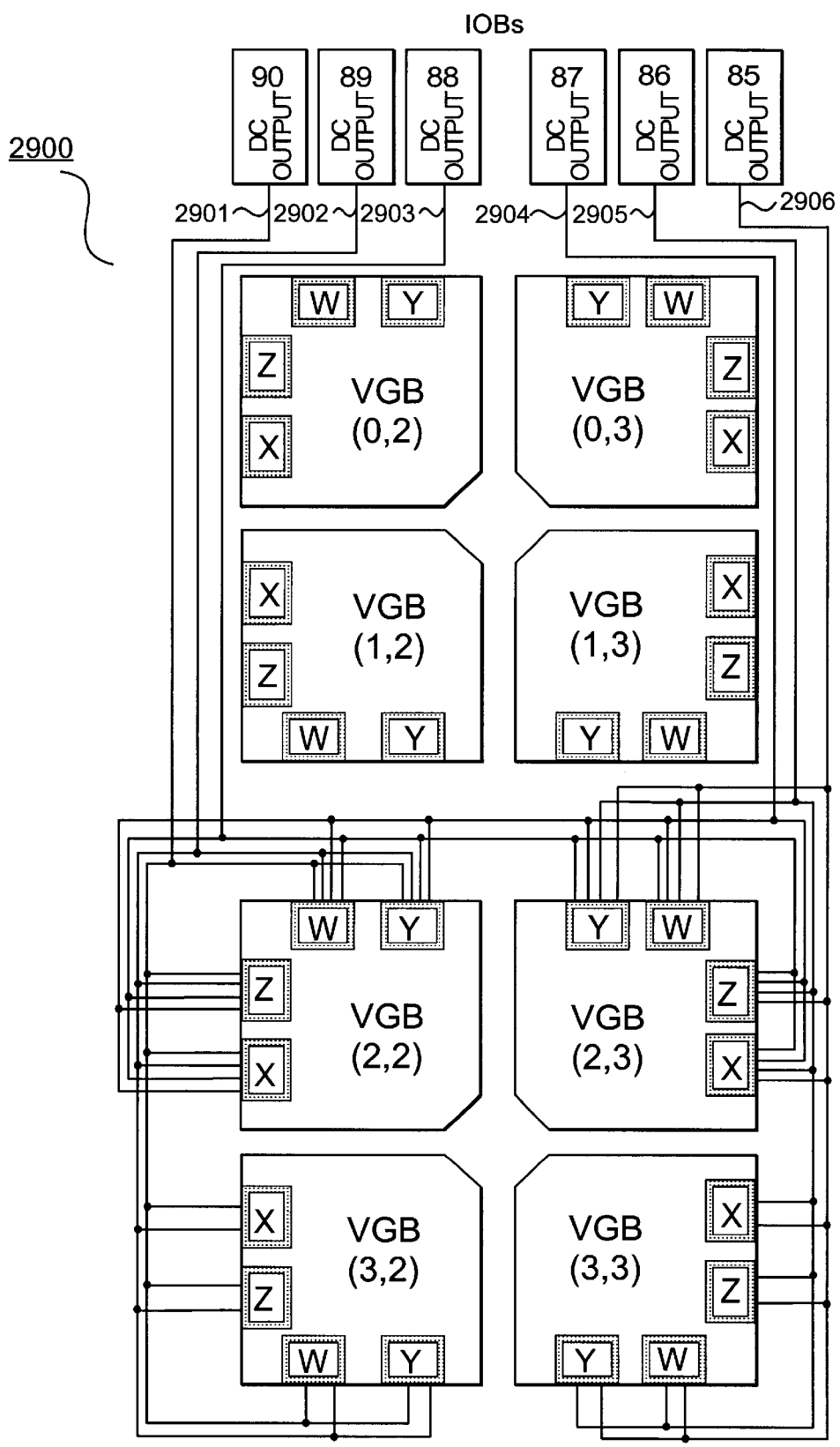
FIG. 12 illustrates a direct connect architecture between a next-adjacent non-corner super-VGB and non-corner IOBs.

FIG. 12 illustrates an embodiment of direct connections between non-corner IOBs and a next-adjacent super-VGB. FIG. 12 illustrates a direct connect architecture 2900 in which non-corner IOBs are directly connected to next-adjacent super-VGBs. Specifically, an IOB direct connect output from IOB 40 is connected to direct connect line 2901. Direct connect line 2901 is connected to CBBs Y, W. Z, and X in VGBs (2,2), (3,2). In an embodiment, the length and capacitance of direct connect line 2901 is approximately twice that of a comparable direct connect line illustrated in FIG. 11. Consequently, a larger driving amplifier than is used to drive the direct connect lines illustrated in FIG. 11 is necessary to drive the direct connect lines illustrated in FIG. 12. The direct connect output of IOB 89 is connected to direct connect line 2902. Direct connect line 2902 is connected to CBBs Y, W, Z, and X in VGBs (2,2), (3,2). Likewise, a direct connect output from IOBs 88 and 87 are connected to direct connect lines 2903 and 2904 respectively. Direct connect line 2903 is connected to CBBs Y, W, Z, and X in VGBs (2,2), (2,3). The direct connect line 2904 is connected to CBBs Y, W, Z, and X in VGB (2,2), (2,3).

A similar direct connect architecture may be repeated for other non-corner IOBs and next-adjacent super-VGBs.

Likewise, a direct connect architecture for driving non-corner IOB direct connect inputs from next-adjacent super-VGBS may be used.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A field programmable gate array (FPGA) device, comprising:
    (a) an input/output block (IOB), including:
        a first sized line driving amplifier for generating a first signal at a first output, and,
        a second sized line driving amplifier for generating a second signal at a second output, wherein the first sized line driving amplifier has a different size than the second sized line driving amplifier; and
    (b) an inter-connect network for carrying a plurality of signals, wherein the inter-connect network includes:
        a first line, coupled to the first JOB output, having a first capacitance,
        a second line, coupled to the second JOB output, having a second capacitance, and
        a third sized line driving amplifier for generating a third signal at a third output coupled to a third line in the interconnect network.

2. The FPGA device of claim 1, wherein the first line is a direct connect line.

3. The FPGA device of claim 2, wherein the second line is a dendrite line.

4. The FPGA device of claim 2, wherein the second line is a MaxL line.

5. The FPGA device of claim 1, wherein the first sized line driving amplifier includes a PMOS transistor having a polysilicon gate width of approximately 20 micron and an NMOS transistor having a polysilicon gate width of approximately 10 micron.

6. A field programmable gate array (FPGA) device, comprising:

(a) a plurality of variable grain blocks (VGBs) arranged substantially in a matrix;

(b) a plurality of input/output blocks (IOBs) arranged about the matrix of VGBs;

(c) an IOB, in the plurality of IOBs, including:

a first sized driving amplifier for generating a first signal at a first output, and, a second sized driving amplifier for generating a second signal at a second output, wherein the first sized driving amplifier has a different size than the second sized driving amplifier; and, (d) an inter-connect network for carrying a plurality of signals, wherein the inter-connect network includes:

a first line, coupled to the first IOB output, having a predetermined first length; and, a second line, coupled to the second IOB output, having a predetermined second length.

7. The FPGA device of claim 6, wherein the predetermined first length is approximately 750 microns and the predetermined second length is approximately 1200 microns.

8. The FPGA device of claim 6, wherein the first line has a first capacitance of between approximately 0.5 pf and approximately 2.24 pf capacitance and the second line has a second capacitance of between approximately 3.6 pf and approximately 14 pf.

9. The FPGA device of claim 6, wherein the first line is a direct connect line.

10. The FPGA device of claim 6, wherein the second line is a dendrite line.

11. The FPGA device of claim 6, wherein the second line is a MaxL line.

12. The FPGA device of claim 6, wherein the first sized driving amplifier comprises:

a first PMOS transistor having a gate, a source for coupling to a voltage source and a drain coupled to the first output;

a first NMOS transistor having a drain coupled to the first output and a source for coupling to ground; wherein the second sized driving amplifier comprises:

a second PMOS transistor having a gate, a source, and a drain, wherein the source is for coupling to a voltage source and the drain is coupled to the second output;

a second NMOS transistor having a gate, a source, and a drain, wherein the drain is coupled to the second output and the source is for coupling to a ground;

a NAND gate, coupled to the second PMOS gate, responsive to a first and second signal;

a NOR gate, coupled to the second NMOS gate, responsive to the first and second signal; and an inverter coupled to the NOR gate.

13. The FPGA device of claim 6, wherein the first and second sized driving amplifiers are tri-state amplifiers.

* * * * *

UNITED STATES PATENT AND TRADEMARK OFFICE
CERTIFICATE OF CORRECTION

PATENT NO. : 6,218,857 B1
DATED : April 17, 2001
INVENTOR(S) : Sharpe-Geisler et al.

It is certified that error appears in the above-identified patent and that said Letters Patent is hereby corrected as shown below:

<u>Column 5,</u>
Line 23, please delete "a," and insert -- a --.

<u>Column 6,</u>
Line 2, please delete "were" and insert -- 'er' --.

<u>Column 12,</u>
Line 63, please delete "7325 84" and insert -- 73-84 --.

<u>Column 18,</u>
Line 4, please delete "718", and insert -- 7-18 --.
Line 59, please delete "JOB" and insert -- IOB --.
Line 60, please insert -- and -- after the comma.
Line 61, please delete "JOB" and insert "IOB".

Signed and Sealed this

Thirteenth Day of November, 2001

Attest:

NICHOLAS P. GODICI
Attesting Officer   Acting Director of the United States Patent and Trademark Office